US011277151B2

(12) United States Patent
Soriaga et al.

(10) Patent No.: US 11,277,151 B2
(45) Date of Patent: *Mar. 15, 2022

(54) MULTIPLE LOW DENSITY PARITY CHECK (LDPC) BASE GRAPH DESIGN

(71) Applicant: QUALCOMM Incorporated, San Diego, CA (US)

(72) Inventors: Joseph Binamira Soriaga, San Diego, CA (US); Gabi Sarkis, San Diego, CA (US); Shrinivas Kudekar, Roswell, GA (US); Thomas Richardson, South Orange, NJ (US); Vincent Loncke, Piscataway, NJ (US)

(73) Assignee: Qualcomm Incorporated, San Diego, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/714,606

(22) Filed: Dec. 13, 2019

(65) Prior Publication Data
US 2020/0119749 A1 Apr. 16, 2020

Related U.S. Application Data

(63) Continuation of application No. 15/943,624, filed on Apr. 2, 2018, now Pat. No. 10,560,118, which is a (Continued)

(51) Int. Cl.
H03M 13/11 (2006.01)
H03M 13/00 (2006.01)
H03M 13/03 (2006.01)

(52) U.S. Cl.
CPC ..... H03M 13/1102 (2013.01); H03M 13/036 (2013.01); H03M 13/116 (2013.01); (Continued)

(58) Field of Classification Search
CPC ..................................................... H04L 1/0057
(Continued)

(56) References Cited

U.S. PATENT DOCUMENTS 6,633,865 B1 10/2003 Liao
6,961,888 B2 11/2005 Jin et al.
(Continued)

FOREIGN PATENT DOCUMENTS

KR 20090130176 A 12/2009
RU 2520405 C2 6/2014
(Continued)

OTHER PUBLICATIONS

IEEE: "IEEE Std 802.16e-2005, Air Interface for Fixed and Mobile Broadband Wireless Access Systems, Amendment 2 and Corrigendum 1 to IEEE Std 802.16-2004", IEEE STD 802.16E-2005, Feb. 28, 2006 (Feb. 28, 2006), pp. 626-630, XP002515198.
(Continued)

Primary Examiner — Fritz Alphonse
(74) Attorney, Agent, or Firm — Qualcomm Incorporated

(57) ABSTRACT

Aspects of the present disclosure relate to low density parity check (LDPC) coding utilizing LDPC base graphs. Two or more LDPC base graphs may be maintained that are associated with different ranges of overlapping information block lengths. A particular LDPC base graph may be selected for an information block based on the information block length of the information block. Additional metrics that may be considered when selecting the LDPC base graph may include the code rate utilized to encode the information block and/or the lift size applied to each LDPC base graph to produce the information block length of the information block.

28 Claims, 10 Drawing Sheets

Related U.S. Application Data continuation of application No. 15/709,400, filed on Sep. 19, 2017, now Pat. No. 10,340,949.

(60) Provisional application No. 62/455,450, filed on Feb. 6, 2017.

(52) U.S. Cl.
CPC ..... *H03M 13/1137* (2013.01); *H03M 13/616* (2013.01); *H03M 13/635* (2013.01); *H03M 13/6516* (2013.01)

(58) Field of Classification Search
USPC .......................................................... 713/776
See application file for complete search history.

(56) References Cited

U.S. PATENT DOCUMENTS

| | | | |
|---|---|---|---|
| 7,133,853 B2 | 11/2006 | Richardson et al. | |
| 7,231,557 B2* | 6/2007 | Jin .................... | H03M 13/2957 714/701 |
| 7,237,171 B2* | 6/2007 | Richardson ........ | H03M 13/1137 714/752 |
| 7,237,181 B2* | 6/2007 | Richardson ....... | H03M 13/2963 714/780 |
| 7,552,097 B2 | 6/2009 | Richardson et al. | |
| 7,627,801 B2 | 12/2009 | Jin et al. | |
| 8,495,459 B2 | 7/2013 | Myung et al. | |
| 8,751,902 B2 | 6/2014 | Jin et al. | |
| 10,340,949 B2* | 7/2019 | Soriaga ............... | H03M 13/635 |
| 10,454,499 B2 | 10/2019 | Richardson et al. | |
| 10,735,134 B2* | 8/2020 | Soriaga ............... | H03M 13/618 |
| 2003/0033575 A1 | 2/2003 | Richardson et al. | |
| 2004/0098659 A1 | 5/2004 | Bjerke et al. | |
| 2004/0262376 A1 | 12/2004 | Mezard et al. | |
| 2006/0026486 A1 | 2/2006 | Richardson et al. | |
| 2006/0036925 A1 | 2/2006 | Kyung et al. | |
| 2006/0274687 A1 | 12/2006 | Kim | |
| 2007/0094580 A1 | 4/2007 | Livshitz | |
| 2008/0178065 A1 | 7/2008 | Khandekar et al. | |
| 2008/0298334 A1* | 12/2008 | Arviv .................... | H04L 1/0048 370/341 |
| 2009/0113256 A1 | 4/2009 | Radosavljevic et al. | |
| 2009/0113276 A1 | 4/2009 | Radosavljevic et al. | |
| 2009/0125735 A1 | 5/2009 | Zimmerman | |
| 2010/0257425 A1 | 10/2010 | Yue et al. | |
| 2010/0325511 A1 | 12/2010 | Oh et al. | |
| 2013/0086445 A1 | 4/2013 | Yedidia et al. | |
| 2016/0012465 A1* | 1/2016 | Sharp .................. | G06Q 20/384 705/14.17 |
| 2018/0007712 A1* | 1/2018 | Lou ..................... | H04W 74/006 |
| 2018/0226988 A1 | 8/2018 | Soriaga et al. | |
| 2018/0226989 A1 | 8/2018 | Soriaga et al. | |
| 2020/0028523 A1 | 1/2020 | Li et al. | |
| 2020/0044665 A1* | 2/2020 | Zheng ................ | H03M 13/1102 |
| 2020/0235759 A1 | 7/2020 | Ye et al. | |
| 2020/0404069 A1* | 12/2020 | Li .......................... | H04L 67/289 |

FOREIGN PATENT DOCUMENTS

| | | |
|---|---|---|
| TW | I272777 B | 2/2007 |
| WO | 2008092040 A2 | 7/2008 |
| WO | WO-2014117836 A1 | 8/2014 |
| WO | WO-2017197267 | 11/2017 |

OTHER PUBLICATIONS

International Search Report and Written Opinion—PCT/US2018/014528—ISA/EPO—dated May 3, 2018.

International Preliminary Report on Patentability—PCT/US2018/014528, The International Bureau of WIPO—Geneva, Switzerland, dated Aug. 15, 2019.

Mackay D.J.C., "Good Error-Correcting Codes Based on Very Sparse Matrices," IEEE Transactions on Information Theory, Mar. 1999, vol. 45 (2), pp. 399-431.

Nokia: "Structured LDPC Code Design; 11-04-1362-00-000n-structured-ldpc-code-design", IEEE Draft; 11-04-1362-00-000N-Structured-LDPC-Code-Design, IEEE-SA Mentor, Piscataway, NJ, USA, vol. 802.11n, Nov. 5, 2004 (Nov. 5, 2004), pp. 1-11, XP017690013, [retrieved on Nov. 5, 2004].

QUALCOMM Incorporated: "LDPC Rate Compatible Design Overview", 3GPP Draft; R1-1610137, 3rd Generation Partnership Project (3GPP), Mobile Competence Centre, 650, Route Des Lucioles; F-06921; Sophia-Anti Polis Cedex, vol. RAN WG1. No. Lisbon, Portugal, Oct. 9, 2016, 27 pages, XP051150160, Retrieved from the Internet: URL: http://www.3gpp.org/ftp/Meetings_3GPP_SYNC/RAN1/Docs/ [retrieved on Oct. 9, 2016].

Roth C., et al., "A 15.8 pJ/bit/iter Quasi-Cyclic LDPC Decoder for IEEE 802.11n in 90 nm CMOS," IEEE Asian Solid-State Circuits Conference, Nov. 8-10, 2010, 4 pages.

Zhang Z., et al., "An Efficient 10GBASE-T Ethernet LDPC Decoder Design With Low Error Floors," IEEE Journal of Solid-State Circuits, Apr. 2010, vol. 45 (4), pp. 843-855.

Qualcomm Incorporated: "LDPC Rate Compatible Design"[online], 3GPP Draft, 3GPP TSG-RAN WG1 Ad Hoc, R1-1700830_LDPC_Rate_Compatible_Design, 3rd Generation Partnership Project (3GPP), Mobile Competence Centre, 650, Route Des Lucioles, F-06921 Sophia-Antipolis Cedex, France, vol. RAN WG1, No. Spokane, USA, Jan. 16, 2017-Jan. 20, 2017, Jan. 16, 2017 (Jan. 16, 2017), 19 Pages, XP051208349, Retrieved from the Internet: URL: http://www.3gpp.org/ftp/Meetings_3GPP_SYNC/RAN1/Docs/ [retrieved on Jan. 16, 2017].

Taiwan Search Report—TW107102002—TIPO—dated Jul. 1, 2021.

\* cited by examiner $$H = \begin{bmatrix} 0 & 0 & 1 & 0 & 0 & 1 & 1 & 0 & 0 & 0 & 0 & 0 \\ 1 & 1 & 0 & 0 & 1 & 0 & 0 & 0 & 0 & 0 & 0 & 1 \\ 0 & 0 & 0 & 1 & 0 & 0 & 0 & 1 & 1 & 1 & 0 & 0 \\ 0 & 1 & 0 & 0 & 0 & 1 & 0 & 0 & 1 & 0 & 1 & 0 \\ 1 & 0 & 1 & 0 & 0 & 0 & 0 & 1 & 0 & 0 & 1 & 0 \\ 0 & 0 & 0 & 1 & 1 & 0 & 0 & 0 & 0 & 1 & 0 & 1 \\ 1 & 0 & 0 & 0 & 1 & 0 & 1 & 0 & 0 & 1 & 1 & 0 \\ 0 & 1 & 1 & 0 & 0 & 0 & 0 & 1 & 1 & 0 & 0 & 0 \end{bmatrix}$$

(columns $c_1\, c_2\, c_3\, c_4\, c_5\, c_6\, c_7\, c_8\, c_9\, c_{10}\, c_{11}\, c_{12}$)

FIG. 3

MULTIPLE LOW DENSITY PARITY CHECK (LDPC) BASE GRAPH DESIGN

PRIORITY CLAIM

The present Application for Patent is a Continuation of Non-Provisional application Ser. No. 15/943,624 filed in the U.S. Patent and Trademark Office on Apr. 2, 2018, the entire content of which is incorporated herein by reference as if fully set forth below in its entirety and for all applicable purposes. Non-Provisional patent application Ser. No. 15/943,624 is a Continuation of Non-Provisional patent application Ser. No. 15/709,400 filed in the U.S. Patent and Trademark Office on Sep. 19, 2017, issued as U.S. Pat. No. 10,340,949 on Jul. 2, 2019, the entire content of which is incorporated herein by reference as if fully set forth below in its entirety and for all applicable purposes. Non-Provisional application Ser. No. 15/709,400 claims priority to Provisional Patent Application No. 62/455,450 filed in the U.S. Patent and Trademark Office on Feb. 6, 2017, the entire content of which is incorporated herein by reference as if fully set forth below in its entirety and for all applicable purposes.

TECHNICAL FIELD

The technology discussed below relates generally to wireless communication systems, and more particularly, to low density parity check (LDPC) coding.

BACKGROUND

Block codes, or error correcting codes are frequently used to provide reliable transmission of digital messages over noisy channels. In a typical block code, an information message or sequence is split up into blocks, and an encoder at the transmitting device then mathematically adds redundancy to the information message. Exploitation of this redundancy in the encoded information message is the key to reliability of the message, enabling correction for any bit errors that may occur due to noise. That is, a decoder at the receiving device can take advantage of the redundancy to reliably recover the information message even though bit errors may occur, in part, due to the addition of noise to the channel.

Many examples of such error correcting block codes are known to those of ordinary skill in the art, including Hamming codes, Bose-Chaudhuri-Hocquenghem (BCH) codes, turbo codes, and low-density parity check (LDPC) codes, among others. Many existing wireless communication networks utilize such block codes, such as 3GPP LTE networks, which utilize turbo codes; and IEEE 802.11n Wi-Fi networks, which utilize LDPC codes.

For future networks, such as fifth generation (5G) New Radio networks, LDPC codes may continue to be implemented to support a wide range of information block lengths and a wide range of code rates. In order to achieve a high throughput with efficient hardware utilization, additional enhancements of LDPC codes are desired.

SUMMARY

The following presents a simplified summary of one or more aspects of the present disclosure, in order to provide a basic understanding of such aspects. This summary is not an extensive overview of all contemplated features of the disclosure, and is intended neither to identify key or critical elements of all aspects of the disclosure nor to delineate the scope of any or all aspects of the disclosure. Its sole purpose is to present some concepts of one or more aspects of the disclosure in a simplified form as a prelude to the more detailed description that is presented later.

Various aspects of the disclosure relate to mechanisms for low density parity check (LDPC) coding utilizing LDPC base graphs. Two or more LDPC base graphs may be maintained, each associated with a different range of information block lengths and/or code rates. A particular LDPC base graph may be selected for an information block based on the information block length of the information block and/or the code rate utilized to encode the information block. Other metrics that may be considered when selecting the LDPC base graph may include, for example, the lift size applied to each LDPC base graph to produce the information block length of the information block.

In one aspect of the disclosure, a method of low density parity check (LDPC) decoding is provided. The method includes maintaining a first LDPC base graph associated with a first information block length range and a second LDPC base graph associated with at least one of a second information block length range or a code rate range. The method further includes receiving a codeword over a wireless air interface from a transmitter, selecting a select LDPC base graph from the plurality of LDPC base graphs for decoding the codeword based, at least in part, on an information block length or a code rate associated with the codeword, and decoding the codeword utilizing the select LDPC base graph to produce an information block having the information block length.

Another aspect of the disclosure provides an apparatus configured for low density parity check (LDPC) coding. The apparatus includes a transceiver, a memory, and a processor communicatively coupled to the transceiver and the memory. The processor is configured to maintain, within the memory, a first LDPC base graph associated with a first information block length range and a second LDPC base graph associated with at least one of a second information block length range or a code rate range. The processor is further configured to receive a codeword over a wireless air interface from a transmitter via the transceiver, select a select LDPC base graph from the plurality of LDPC base graphs for decoding the codeword based, at least in part, on an information block length or a code rate associated with the codeword, and decode the codeword utilizing the select LDPC base graph to produce an information block having the information block length.

Another aspect of the disclosure provides a wireless communication device. The wireless communication device includes means for maintaining a first LDPC base graph associated with a first information block length range and a second LDPC base graph associated with at least one of a second information block length range or a code rate range. The wireless communication device further includes means for receiving a codeword over a wireless air interface from a transmitter, selecting a select LDPC base graph from the plurality of LDPC base graphs for decoding the codeword based, at least in part, on an information block length or a code rate associated with the codeword, and means for decoding the codeword utilizing the select LDPC base graph to produce an information block having the information block length.

Another aspect of the disclosure provides a non-transitory computer-readable medium storing computer executable code for causing a computer to maintain a first LDPC base graph associated with a first information block length range and a second LDPC base graph associated with at least one of a second information block length range or a code rate range. The non-transitory computer-readable medium further includes code for causing the computer to receive a codeword over a wireless air interface from a transmitter, select a select LDPC base graph from the plurality of LDPC base graphs for decoding the codeword based, at least in part, on an information block length or a code rate associated with the codeword, and decoding the codeword utilizing the select LDPC base graph to produce an information block having the information block length.

These and other aspects of the invention will become more fully understood upon a review of the detailed description, which follows. Other aspects, features, and embodiments of the present invention will become apparent to those of ordinary skill in the art, upon reviewing the following description of specific, exemplary embodiments of the present invention in conjunction with the accompanying figures. While features of the present invention may be discussed relative to certain embodiments and figures below, all embodiments of the present invention can include one or more of the advantageous features discussed herein. In other words, while one or more embodiments may be discussed as having certain advantageous features, one or more of such features may also be used in accordance with the various embodiments of the invention discussed herein. In similar fashion, while exemplary embodiments may be discussed below as device, system, or method embodiments it should be understood that such exemplary embodiments can be implemented in various devices, systems, and methods.

BRIEF DESCRIPTION OF THE DRAWINGS

FIG. 3 illustrates an example of a low density parity check (LDPC) matrix according to some aspects of the present disclosure.

DETAILED DESCRIPTION

The detailed description set forth below in connection with the appended drawings is intended as a description of various configurations and is not intended to represent the only configurations in which the concepts described herein may be practiced. The detailed description includes specific details for the purpose of providing a thorough understanding of various concepts. However, it will be apparent to those skilled in the art that these concepts may be practiced without these specific details. In some instances, well known structures and components are shown in block diagram form in order to avoid obscuring such concepts.

Figure 1:
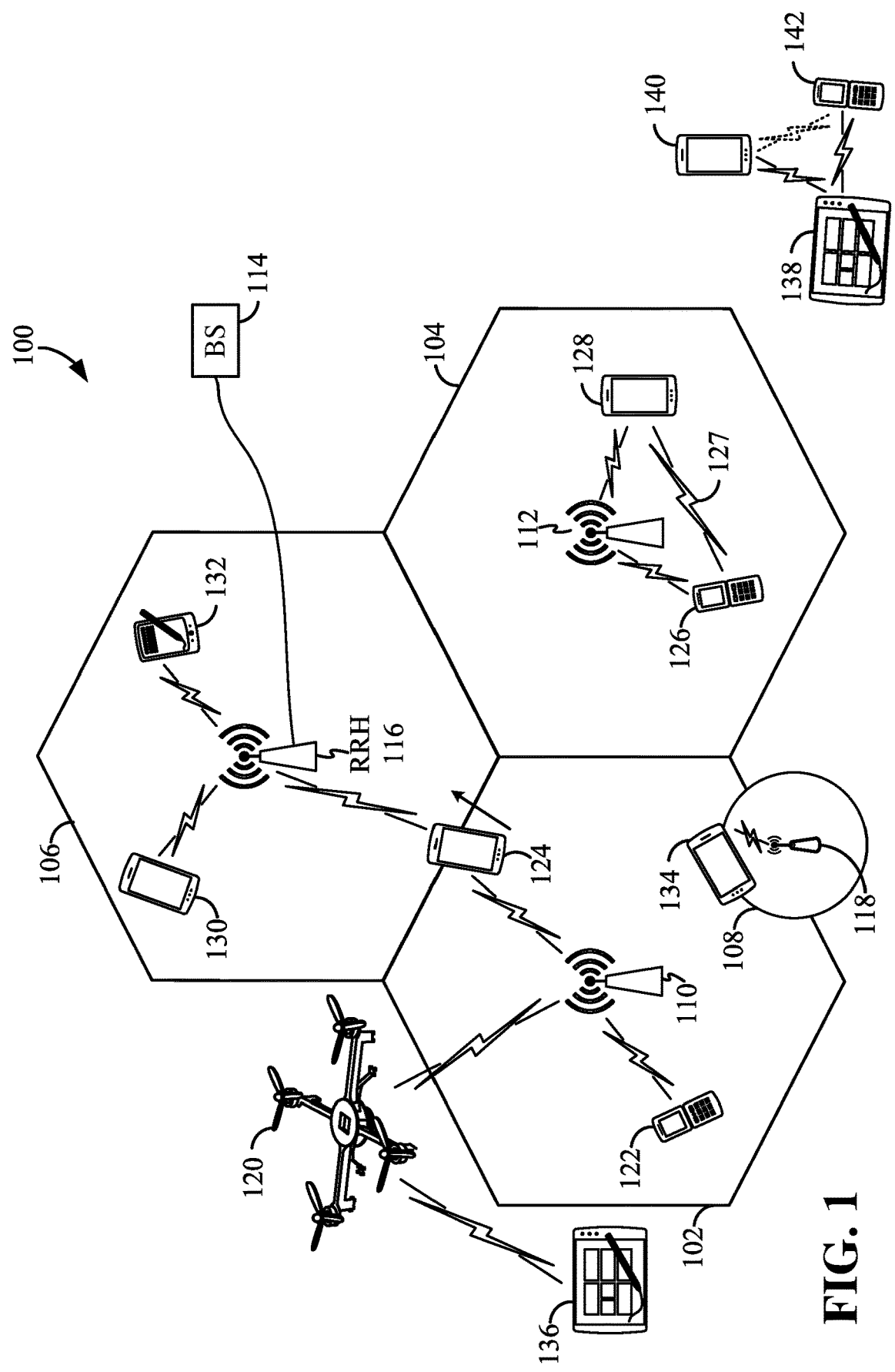
FIG. 1 is a diagram illustrating an example of a radio access network according to some aspects of the present disclosure.

The various concepts presented throughout this disclosure may be implemented across a broad variety of telecommunication systems, network architectures, and communication standards. Referring now to FIG. 1, as an illustrative example without limitation, a simplified schematic illustration of a radio access network 100 is provided. The radio access network 100 may be a next generation (e.g., fifth generation (5G) or New Radio (NR)) radio access network or a legacy (3G or 4G) radio access network. In addition, one or more nodes in the radio access network 100 may be next generation nodes or legacy nodes.

As used herein, the term legacy radio access network refers to a network employing a third generation (3G) wireless communication technology based on a set of standards that complies with the International Mobile Telecommunications-2000 (IMT-2000) specifications or a fourth generation (4G) wireless communication technology based on a set of standards that comply with the International Mobile Telecommunications Advanced (ITU-Advanced) specification. For example, some the standards promulgated by the 3rd Generation Partnership Project (3GPP) and the 3rd Generation Partnership Project 2 (3GPP2) may comply with IMT-2000 and/or ITU-Advanced. Examples of such legacy standards defined by the 3rd Generation Partnership Project (3GPP) include, but are not limited to, Long-Term Evolution (LTE), LTE-Advanced, Evolved Packet System (EPS), and Universal Mobile Telecommunication System (UMTS). Additional examples of various radio access technologies based on one or more of the above-listed 3GPP standards include, but are not limited to, Universal Terrestrial Radio Access (UTRA), Evolved Universal Terrestrial Radio Access (eUTRA), General Packet Radio Service (GPRS) and Enhanced Data Rates for GSM Evolution (EDGE). Examples of such legacy standards defined by the 3rd Generation Partnership Project 2 (3GPP2) include, but are not limited to, CDMA2000 and Ultra Mobile Broadband (UMB). Other examples of standards employing 3G/4G wireless communication technology include the IEEE 802.16 (WiMAX) standard and other suitable standards.

As further used herein, the term next generation radio access network generally refers to a network employing continued evolved wireless communication technologies. This may include, for example, a fifth generation (5G) wireless communication technology based on a set of standards. The standards may comply with the guidelines set forth in the 5G White Paper published by the Next Generation Mobile Networks (NGMN) Alliance on Feb. 17, 2015. For example, standards that may be defined by the 3GPP following LTE-Advanced or by the 3GPP2 following CDMA2000 may comply with the NGMN Alliance 5G White Paper. Standards may also include pre-3GPP efforts specified by Verizon Technical Forum and Korea Telecom SIG.

The geographic region covered by the radio access network 100 may be divided into a number of cellular regions (cells) that can be uniquely identified by a user equipment (UE) based on an identification broadcasted over a geographical area from one access point or base station. FIG. 1 illustrates macrocells 102, 104, and 106, and a small cell 108, each of which may include one or more sectors (not shown). A sector is a sub-area of a cell. All sectors within one cell are served by the same base station. A radio link within a sector can be identified by a single logical identification belonging to that sector. In a cell that is divided into sectors, the multiple sectors within a cell can be formed by groups of antennas with each antenna responsible for communication with UEs in a portion of the cell.

In general, a respective base station (BS) serves each cell. Broadly, a base station is a network element in a radio access network responsible for radio transmission and reception in one or more cells to or from a UE. A BS may also be referred to by those skilled in the art as a base transceiver station (BTS), a radio base station, a radio transceiver, a transceiver function, a basic service set (BSS), an extended service set (ESS), an access point (AP), a Node B (NB), an eNode B (eNB), a gNode B (gNB), or some other suitable terminology.

In FIG. 1, two base stations 110 and 112 are shown in cells 102 and 104; and a third base station 114 is shown controlling a remote radio head (RRH) 116 in cell 106. That is, a base station can have an integrated antenna or can be connected to an antenna or RRH by feeder cables. In the illustrated example, the cells 102, 104, and 106 may be referred to as macrocells, as the base stations 110, 112, and 114 support cells having a large size. Further, a base station 118 is shown in the small cell 108 (e.g., a microcell, picocell, femtocell, home base station, home Node B, home eNode B, etc.) which may overlap with one or more macrocells. In this example, the cell 108 may be referred to as a small cell, as the base station 118 supports a cell having a relatively small size. Cell sizing can be done according to system design as well as component constraints. It is to be understood that the radio access network 100 may include any number of wireless base stations and cells. Further, a relay node may be deployed to extend the size or coverage area of a given cell. The base stations 110, 112, 114, 118 provide wireless access points to a core network for any number of mobile apparatuses.

FIG. 1 further includes a quadcopter or drone 120, which may be configured to function as a base station. That is, in some examples, a cell may not necessarily be stationary, and the geographic area of the cell may move according to the location of a mobile base station such as the quadcopter 120.

In general, base stations may include a backhaul interface for communication with a backhaul portion (not shown) of the network. The backhaul may provide a link between a base station and a core network (not shown), and in some examples, the backhaul may provide interconnection between the respective base stations. The core network may be a part of a wireless communication system and may be independent of the radio access technology used in the radio access network. Various types of backhaul interfaces may be employed, such as a direct physical connection, a virtual network, or the like using any suitable transport network.

The radio access network 100 is illustrated supporting wireless communication for multiple mobile apparatuses. A mobile apparatus is commonly referred to as user equipment (UE) in standards and specifications promulgated by the 3rd Generation Partnership Project (3GPP), but may also be referred to by those skilled in the art as a mobile station (MS), a subscriber station, a mobile unit, a subscriber unit, a wireless unit, a remote unit, a mobile device, a wireless device, a wireless communications device, a remote device, a mobile subscriber station, an access terminal (AT), a mobile terminal, a wireless terminal, a remote terminal, a handset, a terminal, a user agent, a mobile client, a client, or some other suitable terminology. A UE may be an apparatus that provides a user with access to network services.

Within the present document, a "mobile" apparatus need not necessarily have a capability to move, and may be stationary. The term mobile apparatus or mobile device broadly refers to a diverse array of devices and technologies. For example, some non-limiting examples of a mobile apparatus include a mobile, a cellular (cell) phone, a smart phone, a session initiation protocol (SIP) phone, a laptop, a personal computer (PC), a notebook, a netbook, a smartbook, a tablet, a personal digital assistant (PDA), and a broad array of embedded systems, e.g., corresponding to an "Internet of things" (IoT). A mobile apparatus may additionally be an automotive or other transportation vehicle, a remote sensor or actuator, a robot or robotics device, a satellite radio, a global positioning system (GPS) device, an object tracking device, a drone, a multi-copter, a quad-copter, a remote control device, a consumer and/or wearable device, such as eyewear, a wearable camera, a virtual reality device, a smart watch, a health or fitness tracker, a digital audio player (e.g., MP3 player), a camera, a game console, etc. A mobile apparatus may additionally be a digital home or smart home device such as a home audio, video, and/or multimedia device, an appliance, a vending machine, intelligent lighting, a home security system, a smart meter, etc. A mobile apparatus may additionally be a smart energy device, a security device, a solar panel or solar array, a municipal infrastructure device controlling electric power (e.g., a smart grid), lighting, water, etc.; an industrial automation and enterprise device; a logistics controller; agricultural equipment; military defense equipment, vehicles, aircraft, ships, and weaponry, etc. Still further, a mobile apparatus may provide for connected medicine or telemedicine support, i.e., health care at a distance. Telehealth devices may include telehealth monitoring devices and telehealth administration devices, whose communication may be given preferential treatment or prioritized access over other types of information, e.g., in terms of prioritized access for transport of critical service user data traffic, and/or relevant QoS for transport of critical service user data traffic.

Within the radio access network 100, the cells may include UEs that may be in communication with one or more sectors of each cell. For example, UEs 122 and 124 may be in communication with base station 110; UEs 126 and 128 may be in communication with base station 112; UEs 130 and 132 may be in communication with base station 114 by way of RRH 116; UE 134 may be in communication with base station 118; and UE 136 may be in communication with mobile base station 120. Here, each base station 110, 112, 114, 118, and 120 may be configured to provide an access point to a core network (not shown) for all the UEs in the respective cells.

In another example, a mobile network node (e.g., quad-copter 120) may be configured to function as a UE. For example, the quadcopter 120 may operate within cell 102 by communicating with base station 110. In some aspects of the disclosure, two or more UE (e.g., UEs 126 and 128) may communicate with each other using peer to peer (P2P) or sidelink signals 127 without relaying that communication through a base station (e.g., base station 112).

Unicast or broadcast transmissions of control information and/or traffic information (e.g., user data traffic) from a base station (e.g., base station 110) to one or more UEs (e.g., UEs 122 and 124) may be referred to as downlink (DL) transmission, while transmissions of control information and/or traffic information originating at a UE (e.g., UE 122) may be referred to as uplink (UL) transmissions. In addition, the uplink and/or downlink control information and/or traffic information may be time-divided into frames, subframes, slots, mini-slots and/or symbols. As used herein, a symbol may refer to a unit of time that, in an orthogonal frequency division multiplexed (OFDM) waveform, carries one resource element (RE) per sub-carrier. A slot may carry 7 or 14 OFDM symbols. A mini-slot may carry less than 7 OFDM symbols or less than 14 OFDM symbols. A subframe may refer to a duration of 1 ms. Multiple subframes may be grouped together to form a single frame or radio frame. Of course, these definitions are not required, and any suitable scheme for organizing waveforms may be utilized, and various time divisions of the waveform may have any suitable duration.

The air interface in the radio access network 100 may utilize one or more multiplexing and multiple access algorithms to enable simultaneous communication of the various devices. For example, multiple access for uplink (UL) or reverse link transmissions from UEs 122 and 124 to base station 110 may be provided utilizing time division multiple access (TDMA), code division multiple access (CDMA), frequency division multiple access (FDMA), orthogonal frequency division multiple access (OFDMA), sparse code multiple access (SCMA), single-carrier frequency division multiple access (SC-FDMA), resource spread multiple access (RSMA), or other suitable multiple access schemes. Further, multiplexing downlink (DL) or forward link transmissions from the base station 110 to UEs 122 and 124 may be provided utilizing time division multiplexing (TDM), code division multiplexing (CDM), frequency division multiplexing (FDM), orthogonal frequency division multiplexing (OFDM), sparse code multiplexing (SCM), single-carrier frequency division multiplexing (SC-FDM) or other suitable multiplexing schemes.

Further, the air interface in the radio access network 100 may utilize one or more duplexing algorithms. Duplex refers to a point-to-point communication link where both endpoints can communicate with one another in both directions. Full duplex means both endpoints can simultaneously communicate with one another. Half duplex means only one endpoint can send information to the other at a time. In a wireless link, a full duplex channel generally relies on physical isolation of a transmitter and receiver, and suitable interference cancellation technologies. Full duplex emulation is frequently implemented for wireless links by utilizing frequency division duplex (FDD) or time division duplex (TDD). In FDD, transmissions in different directions operate at different carrier frequencies. In TDD, transmissions in different directions on a given channel are separated from one another using time division multiplexing. That is, at some times the channel is dedicated for transmissions in one direction, while at other times the channel is dedicated for transmissions in the other direction, where the direction may change very rapidly, e.g., several times per subframe.

In the radio access network 100, the ability for a UE to communicate while moving, independent of their location, is referred to as mobility. The various physical channels between the UE and the radio access network are generally set up, maintained, and released under the control of a mobility management entity (MME). In various aspects of the disclosure, a radio access network 100 may utilize DL-based mobility or UL-based mobility to enable mobility and handovers (i.e., the transfer of a UE's connection from one radio channel to another). In a network configured for DL-based mobility, during a call with a scheduling entity, or at any other time, a UE may monitor various parameters of the signal from its serving cell as well as various parameters of neighboring cells. Depending on the quality of these parameters, the UE may maintain communication with one or more of the neighboring cells. During this time, if the UE moves from one cell to another, or if signal quality from a neighboring cell exceeds that from the serving cell for a given amount of time, the UE may undertake a handoff or handover from the serving cell to the neighboring (target) cell. For example, UE 124 may move from the geographic area corresponding to its serving cell 102 to the geographic area corresponding to a neighbor cell 106. When the signal strength or quality from the neighbor cell 106 exceeds that of its serving cell 102 for a given amount of time, the UE 124 may transmit a reporting message to its serving base station 110 indicating this condition. In response, the UE 124 may receive a handover command, and the UE may undergo a handover to the cell 106.

In a network configured for UL-based mobility, UL reference signals from each UE may be utilized by the network to select a serving cell for each UE. In some examples, the base stations 110, 112, and 114/116 may broadcast unified synchronization signals (e.g., unified Primary Synchronization Signals (PSSs), unified Secondary Synchronization Signals (SSSs) and unified Physical Broadcast Channels (PBCH)). The UEs 122, 124, 126, 128, 130, and 132 may receive the unified synchronization signals, derive the carrier frequency and subframe timing from the synchronization signals, and in response to deriving timing, transmit an uplink pilot or reference signal. The uplink pilot signal transmitted by a UE (e.g., UE 124) may be concurrently received by two or more cells (e.g., base stations 110 and 114/116) within the radio access network 100. Each of the cells may measure a strength of the pilot signal, and the radio access network (e.g., one or more of the base stations 110 and 114/116 and/or a central node within the core network) may determine a serving cell for the UE 124. As the UE 124 moves through the radio access network 100, the network may continue to monitor the uplink pilot signal transmitted by the UE 124. When the signal strength or quality of the pilot signal measured by a neighboring cell exceeds that of the signal strength or quality measured by the serving cell, the network 100 may handover the UE 124 from the serving cell to the neighboring cell, with or without informing the UE 124.

Although the synchronization signal transmitted by the base stations 110, 112, and 114/116 may be unified, the synchronization signal may not identify a particular cell, but rather may identify a zone of multiple cells operating on the same frequency and/or with the same timing. The use of zones in 5G networks or other next generation communication networks enables the uplink-based mobility framework and improves the efficiency of both the UE and the network, since the number of mobility messages that need to be exchanged between the UE and the network may be reduced.

In various implementations, the air interface in the radio access network 100 may utilize licensed spectrum, unlicensed spectrum, or shared spectrum. Licensed spectrum provides for exclusive use of a portion of the spectrum, generally by virtue of a mobile network operator purchasing a license from a government regulatory body. Unlicensed spectrum provides for shared use of a portion of the spectrum without need for a government-granted license. While compliance with some technical rules is generally still required to access unlicensed spectrum, generally, any operator or device may gain access. Shared spectrum may fall between licensed and unlicensed spectrum, wherein technical rules or limitations may be required to access the spectrum, but the spectrum may still be shared by multiple operators and/or multiple RATs. For example, the holder of a license for a portion of licensed spectrum may provide licensed shared access (LSA) to share that spectrum with other parties, e.g., with suitable licensee-determined conditions to gain access.

In some examples, access to the air interface may be scheduled, wherein a scheduling entity (e.g., a base station) allocates resources for communication among some or all devices and equipment within its service area or cell. Within the present disclosure, as discussed further below, the scheduling entity may be responsible for scheduling, assigning, reconfiguring, and releasing resources for one or more scheduled entities. That is, for scheduled communication, scheduled entities utilize resources allocated by the scheduling entity.

Base stations are not the only entities that may function as a scheduling entity. That is, in some examples, a UE may function as a scheduling entity, scheduling resources for one or more scheduled entities (e.g., one or more other UEs). In other examples, sidelink signals may be used between UEs without necessarily relying on scheduling or control information from a base station. For example, UE 138 is illustrated communicating with UEs 140 and 142. In some examples, the UE 138 is functioning as a scheduling entity or a primary sidelink device, and UEs 140 and 142 may function as a scheduled entity or a non-primary (e.g., secondary) sidelink device. In still another example, a UE may function as a scheduling entity in a device-to-device (D2D), peer-to-peer (P2P), or vehicle-to-vehicle (V2V) network, and/or in a mesh network. In a mesh network example, UEs 140 and 142 may optionally communicate directly with one another in addition to communicating with the scheduling entity 138.

Figure 2:
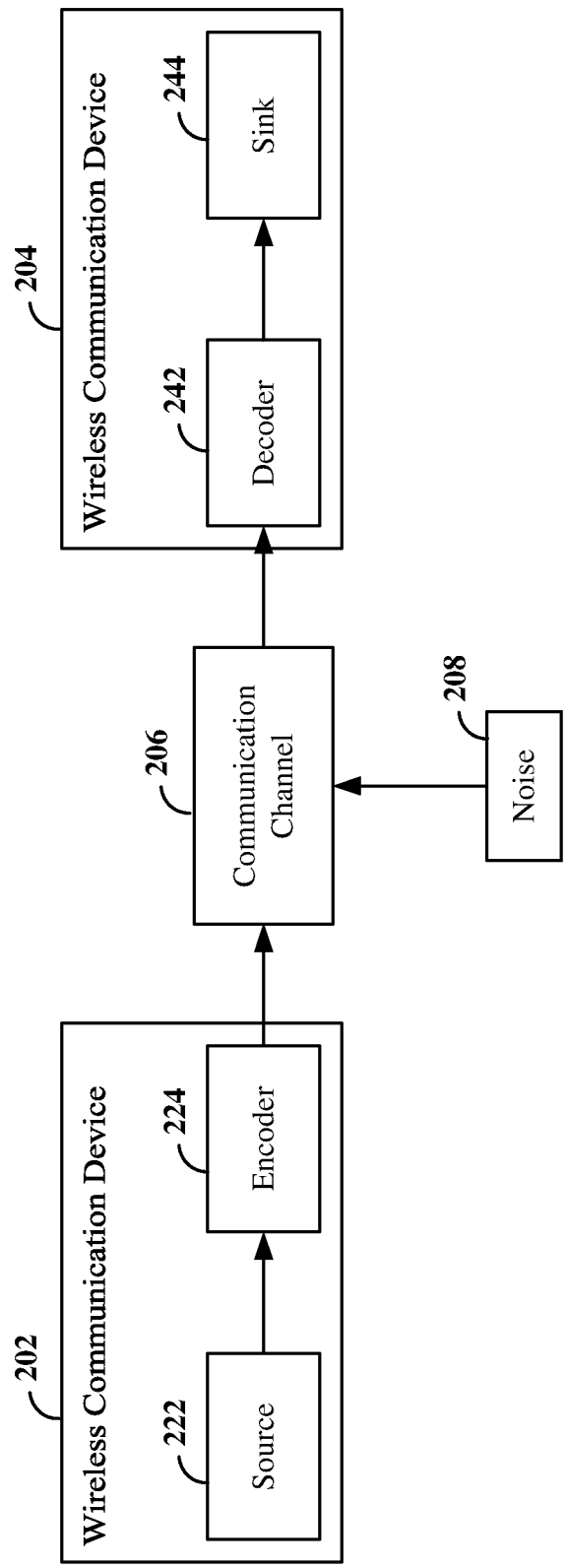
FIG. 2 is a schematic illustration of wireless communication utilizing block codes according to some aspects of the present disclosure.

FIG. 2 is a schematic illustration of wireless communication between a first wireless communication device 202 and a second wireless communication device 204. Each wireless communication device 202 and 204 may be a user equipment (UE), a base station, or any other suitable apparatus or means for wireless communication. In the illustrated example, a source 222 within the first wireless communication device 202 transmits a digital message over a communication channel 206 (e.g., a wireless channel) to a sink 244 in the second wireless communication device 204. To provide for reliable communication of the digital message, it is usually beneficial to take into account the noise 208 that affects the communication channel 206.

Block codes, or error correcting codes are frequently used to provide reliable transmission of digital messages over such channels. In a typical block code, an information message or sequence is split up into blocks, each block having a length of K bits. An encoder 224 at the first (transmitting) wireless communication device 202 then mathematically adds redundancy to the information message, resulting in codewords having a length of N, where N>K. Here, the code rate R is the ratio between the message length and the block length: i.e., R=K/N. Exploitation of this redundancy in the encoded information message is one key to reliability of the message, possibly enabling correction for bit errors that may occur due to the noise 208 or other signal propagation affects. That is, a decoder 242 at the second (receiving) wireless communication device 204 can take advantage of the redundancy to possibly recover the information message even though bit errors may occur, in part, due to the addition of noise to the channel, etc.

Many examples of such error correcting block codes are known to those of ordinary skill in the art, including Hamming codes, Bose-Chaudhuri-Hocquenghem (BCH) codes, turbo codes, and low-density parity check (LDPC) codes, among others. Many existing wireless communication networks utilize such block codes, such as 3GPP LTE networks, which utilize turbo codes; and IEEE 802.11n Wi-Fi networks, which utilize LDPC codes.

LDPC codes are linear forward error correcting codes, where each codeword of length N contains K information bits and C parity check bits (N=K+C). The symbols in an LDPC codeword satisfy C parity check equations of the form:

$$c_a \oplus c_b \oplus c_c \oplus \ldots \oplus c_z = 0,$$

where $c_a$, $c_b$, $c_c$, ..., $c_z$ are the code bits in the parity check equation and $\oplus$ refers to modulo 2 addition.

LDPC codes may be defined by a sparse parity check matrix H. A parity check matrix is a C-row by N-column binary matrix. The rows represent the parity check equations and the columns represent the bits in the codeword. There is a "one" in the i-th row and j-th column if the i-th code bit is contained in the j-th parity check equation. The parity check matrix is sparse in that the matrix has a low density of ones. This sparsity renders low complexity decoding and leads to a simple implementation.

An example of a parity check matrix H is shown in FIG. 3. In the example shown in FIG. 3, the length (N) of the codeword is twelve and the number of parity check bits (C) is nine. Therefore, the parity check matrix H is a 12×9 matrix, with nine parity check equations and twelve bits. Each parity check equation is formed from the code bits $c_1$-$c_{12}$ corresponding to the nonzero locations in each row. For example, the first parity check equation corresponding to the first row may be represented as $c_3 \oplus c_6 \oplus 7 \oplus c_8 = 0$. Thus, the first parity check equation includes the code bits $c_3$, $c_6$, $c_7$, and $c_8$ in the codeword. Similar equations may be constructed for each of the other rows based on the nonzero entries in each row. The matrix H shown in FIG. 3 represents a regular LDPC code in that every code bit is contained in the same number of equations and each equation contains the same number of code bits. For example, in FIG. 3, each code bit $c_1$-$c_{12}$ is contained in three equations and each equation contains four code bits. In other examples, the LDPC code may be irregular, which includes a variable number of ones in the rows and columns.

Figure 4:
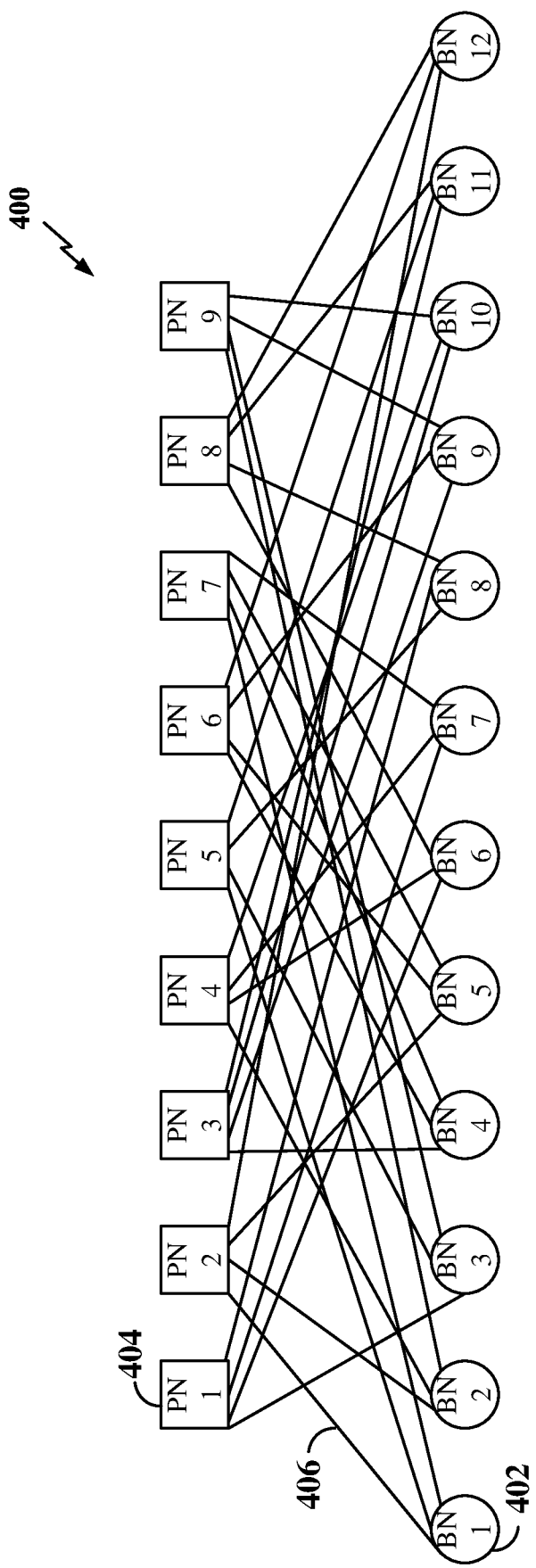
FIG. 4 illustrates an example of a LDPC base graph according to some aspects of the present disclosure.

Decoding of LDPC codes may best be understood by a graphical description. FIG. 4 illustrates an example of an LDPC graph 400 corresponding to the parity check matrix H shown in FIG. 3. The graph 400 has two types of nodes: bit nodes (BN1-BN12) 402 and parity nodes (PN1-PN9) 404. Each bit node represents a code bit and each parity node represents a parity check equation. A line is drawn between a bit node and a parity node if the code bit associated with the bit node is contained within the parity check equation associated with the parity node. Each line may be referred to herein as an edge 406. Thus, if a j-th bit node 402 is connected to an i-th parity node 404 by an edge 406, i.e., the two nodes are neighbors, then there is a "1" in the i-th column and in the j-th row of the parity check matrix H. That is, the intersection of an i-th row and a j-th column contains a "1" where an edge 406 joins the corresponding nodes 402 and 404 and a "0" where there is no edge. As such, each edge 406 corresponds to a non-zero entry in the parity check matrix. Since the graph shown in FIG. 4 corresponds to the parity check matrix shown in FIG. 3, each bit node 402 has three edges 406 connecting it to parity nodes 404 and each parity node 404 has four edges 406 connecting it to bit nodes 402.

A bit sequence associated one-to-one with the bit node sequence is a codeword of the code if and only if, for each parity node 404, the bits neighboring the parity node 404 (via their association with bit nodes 402) sum to zero modulo two, i.e., they comprise an even number of ones. In some cases, some of these bits might be punctured or known. Puncturing refers to the act of removing bits from a codeword to yield, in effect, a shorter codeword of a desired granularity. In the case of LDPC graphs, this means that some of the bit nodes 402 in the graph correspond to bits that are not actually transmitted.

The LDPC decoder and decoding algorithm used to decode LDPC codewords operate by exchanging messages within the graph 400 along the edges 406 and updating these messages by performing computations at the nodes 402 and 404 based on the incoming messages. Each bit node 402 in the graph 400 is initially provided with a soft bit that indicates an estimate of the probability that the bit is a one, as determined by observations from, e.g., the communications channel (e.g., the channel estimate). The bit node 402 broadcasts this soft bit (initial estimate) to the parity nodes 404 on the edges 406 connected to that bit node 402. Each parity node 404, in turn, generates first new estimates for the bits involved in that parity check equation and sends back these first new estimates on the edges 406 back to the bit nodes 402. The first new estimates are calculated based upon all of the initial estimates furnished to the parity node.

For example, consider the first parity node PN1 corresponding to the equation $c_3 \oplus c_6 \oplus 7 \oplus c_8 = 0$. This parity node may receive initial estimates $e_3$, $e_6$, $e_7$, and $e_8$ from the bit nodes BN3, BN6, BN7, and BN8 corresponding to the code bits $c_3$, $c_6$, $c_7$, and $c_8$. The first new estimate for the bit node BN3 corresponding to code bit $c_3$ may then be calculated as:

$$e'_3 = e_6(1-e_7)(1-e_8) + e_7(1-e_6)(1-e_8) + e_8(1-e_6)(1-e_7) + e_6 e_7 e_8.$$

Similar calculations may be made for the new estimates for the remaining bit nodes.

As a result, each bit node 402 is provided different first new estimates by each of the parity nodes 404 connected to it. Each bit node 402 may then determine a respective second new estimate for each of the parity nodes 404 connected to it based on the original channel estimate together with a combination of the first new estimates received from each parity node (except the parity node to which the additional new estimate is sent). Thus, in determining the second new estimate sent from the bit node 402 to a parity node 404, the bit node 404 ignores the first new estimate received from that parity node 404. For example, bit node BN3 will ignore the first new estimate sent from parity node PN1 when determining the second new estimate for parity node PN1. The second new estimate for a particular parity node may then be calculated, for example, as a normalized product of the first new estimates received from the other parity nodes 404, taking into consideration the original channel estimate. This process repeats with parity nodes 404 passing edge messages (estimates) to bit nodes 402 and bit nodes 402 passing edge messages (estimates) to parity nodes 404 until a final estimate is computed at each bit node 402 by computing the normalized product of all of the estimates. A hard decision on each bit may then be made by comparing the final estimate with a threshold (e.g., 0.5).

In some examples, the graph 400 shown in FIG. 4 may be an LDPC graph having dimensions less than that necessary to produce the minimum codeword length utilized in a wireless communication network (e.g., the radio access network 100 shown in FIG. 1). A group of related LDPC graphs may be represented by one of the related LDPC graphs, which may be referred to herein as an "LDPC base graph." For example, an LDPC base graph may be representative of those LDPC graphs having a number of bit nodes $K_b$ (columns in the matrix) within a particular range of bit node numbers (e.g., $x <= K_b <= y$, where x and y define the minimum and maximum number of bit nodes within the group of related LDPC graphs). In some example, the LDPC base graph is the LDPC graph having the maximum number of bit nodes within the group of related LDPC graphs.

To produce an LDPC graph corresponding to a desired information block length K and code rate R, each of the entries in the LDPC matrix representing the LDPC graph may be lifted (e.g., replaced with another matrix) by a lift size Z (e.g., $K_b * Z = K$). For example, if the LDPC graph is represented by a 3×3 matrix and a lift size Z of three is applied to the LDPC graph, the resulting lifted matrix is a 9×9 matrix. In effect, lifting is a technique for generating a relatively large LDPC code from multiple copies of a smaller code. The largest lift size $Z_{max}$ represents the largest degree of parallelism that may be achieved per edge in the LDPC graph, corresponding to the largest information block length $K_{max}$ for an LDPC graph.

The decoder may be implemented to calculate at least one group of P edge messages in parallel. In some examples, the value of P is equal to or greater than the level of parallelism required to reach peak throughput. For example, P may be equal to the largest lift size $Z_{max}$ that is used in the peak throughput case. In one example, to achieve a maximum information block length ($K_{max}$) of 8192 bits, the corresponding maximum lift size ($Z_{max}$), and thus, degree of parallelism P, may be equal to 320 to achieve a peak throughput of 20 Gb/s. However, when the lift size Z is less than P, some of the decoding hardware resources may be idle and not utilized. For example, as K, and in turn, the lift size Z, become smaller, decoder resource utilization efficiency and throughput may decrease.

In various aspects of the disclosure, two or more LDPC base graphs may be designed, each having a different range of graph dimensions (e.g., different ranges of numbers of bit nodes) to improve decoder resource utilization at smaller values of K. Therefore, each LDPC base graph may support a different information block length range (e.g., $K_{low}$ to $K_{high}$). In addition, each information block length range may overlap.

In some examples, a baseline LDPC base graph may be designed to cover all or a large portion of information block lengths and code rates utilized in a wireless communication network. The baseline LDPC base graph may then set the largest information block length $K_{max}$ and largest lift size $Z_{max}$ for the encoder and decoder. One or more additional LDPC base graphs may further be designed to cover one or more subsets of the information block lengths and code rates. In some examples, the additional LDPC base graphs may overlap with the baseline LDPC base graph, but may also cover other information block lengths outside of the information block length range covered by the baseline LDPC base graph. For example, at least one of the LDPC base graphs may include lower information block lengths than those included in the information block length range associated with the baseline LDPC base graph.

In some examples, each of the additional LDPC base graphs supports all of the same code rates as the baseline LDPC base graph. In other examples, one or more of the additional LDPC base graphs may support a subset of the code rates or one or more different code rates. For example, based on a modulation and coding scheme (MCS) table, the code rates supported by an additional LDPC base graph may include those code rates immediately above and below a modulation order transition (e.g., from 16QAM to 32 QAM). One or more of the additional LDPC base graphs may, therefore, utilize the maximum lift size $Z_{max}$ at smaller values of K ($K<K_{max}$). Additional LDPC base graphs may further be designed for other performance benefits. For example, an additional LDPC base graph may be designed to support lower code rates relative to other LDPC base graphs.

In some examples, for an information block of a length K at a given code rate R, an encoder or decoder may select the particular LDPC base graph that maximizes the lift size Z, where $Z<=Z_{max}$. For example, the encoder or decoder may select a first LDPC base graph when a first lift size applied to the first LDPC base graph to produce the information block length is greater than a second lift size applied to a second LDPC base graph to produce the information block length. Similarly, the encoder or decoder may select the second LDPC base graph when the second lift size applied to the first LDPC base graph to produce the information block length is greater than the first lift size applied to a second LDPC base graph to produce the information block length. The first LDPC base graph may correspond, in some examples, to the baseline LDPC base graph, while the second LDPC base graph may correspond to a lower LDPC base graph (e.g., an LDPC base graph including a fewer number of bit nodes).

In some examples, the encoder or decoder may select a particular LDPC graph based on a parallelism constraint at the receiver. Thus, the particular LDPC base graph may be selected based on the information block length K and the parallelism constraint P of the decoder, where $P=Z_{max}$ (e.g., the parallelism constraint sets the maximum lift size). For example, assuming a smallest information block size K at a given rate R supported by multiple LDPC base graphs, the encoder or decoder may select the LDPC base graph that provides the largest lift size Z. As K increases, the encoder or decoder may continue to select the same LDPC base graph while the lift size is less than or equal to the parallelism constraint P. However, at the information block length K where the current LDPC base graphs lift size Z exceeds P, the encoder or decoder may switch to the LDPC base graph that provides the largest lift size Z that is less than or equal to P. This process may be repeated until the maximum information block length $K_{max}$ is reached.

As an example, assume there are three LDPC base graphs, low LDPC base graph ($8<=K_b<=10$), middle LDPC base graph ($16<=K_b<=20$), and high LDPC base graph ($24<=K_b<=30$). With a parallelism constraint or maximum lift size of 320 and a code rate of 1/3, for K<=3200, an LDPC base graph from the low LDPC base graph may be selected, for 3200<K<=6400, an LDPC base graph from the middle LDPC base graph may be selected, and for 6400<K<=8192 ($K_{max}$), an LDPC base graph from the high LDPC base graph may be selected.

In some examples, an LDPC base graph that does not provide the largest lift size may be selected to improve other factors, such as performance. In addition, metrics other than the lift size may be used to select the LDPC base graph. For example, the decoding speed may be used to select the LDPC base graph (e.g., the LDPC base graph providing the highest decoding speed that is less than the peak throughput achieved at the parallelism constraint P may be selected).

Figure 5:
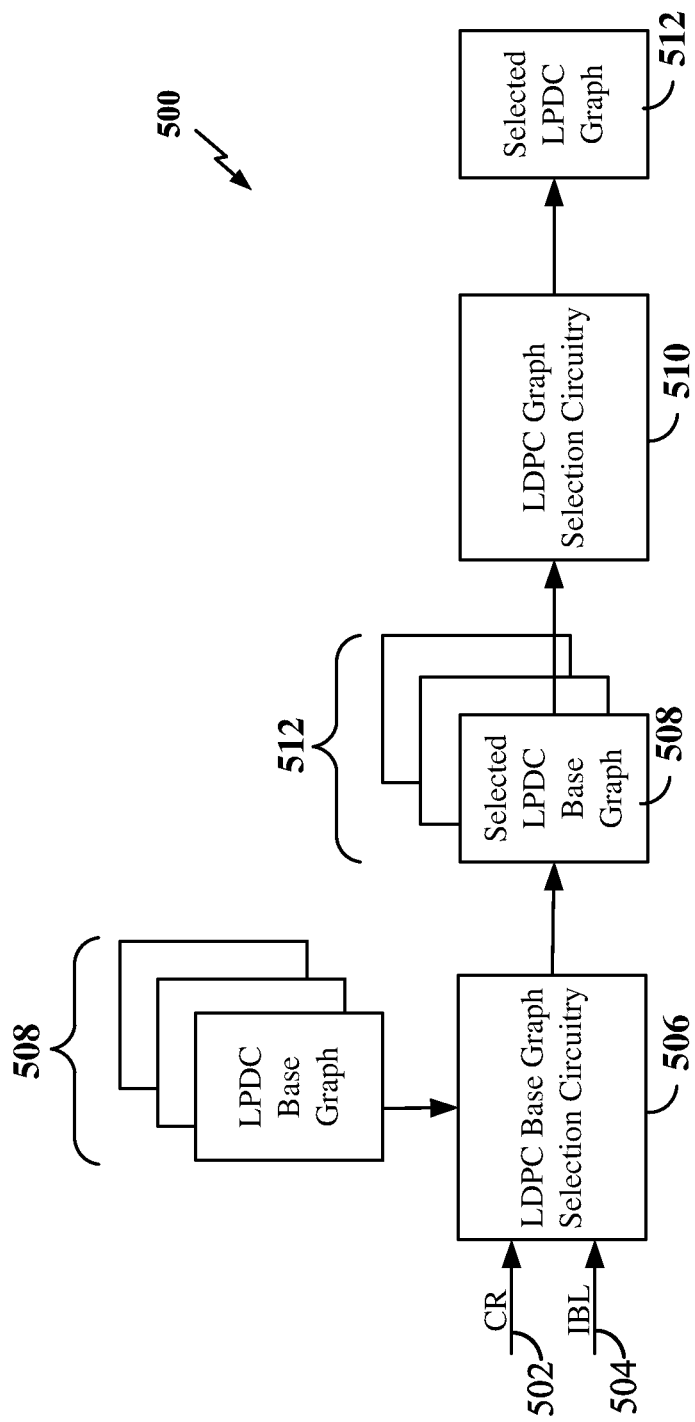
FIG. 5 is a diagram illustrating an example of selecting between two or more LDPC base graphs according to some aspects of the present disclosure.

FIG. 5 is a diagram illustrating an example of a wireless communication device 500 configured to select between two or more LDPC base graphs according to some aspects of the present disclosure. In FIG. 5, prior to encoding an information block, the code rate (CR) 502 and information block length (IBL) 504 of the information block may be provided to LDPC base selection circuitry 506. The LDPC base selection circuitry 506 may then select from two or more LDPC base graphs 508, each having a different range of graph dimensions (e.g., different ranges of numbers of bit nodes). Thus, each LDPC base graph 508 may support a different information block length range (e.g., $K_{low}$ to $K_{high}$). In addition, each information block length range supported by the respective LDPC base graphs 508 may overlap. In some examples, each of the LDPC base graphs 508 are predetermined and loaded into the wireless communication device 500 prior to deployment of the wireless communication device 500.

In some examples, one of the LDPC base graphs 508 may be a baseline LDPC base graph that is designed to cover all or a large portion of information block lengths and code rates utilized in a wireless communication network. For example, the baseline LDPC base graph may set the largest information block length $K_{max}$ and largest lift size $Z_{max}$ for the encoder and decoder. Other LDPC base graphs 508 may be designed to cover one or more subsets of the information block lengths and code rates. In some examples, each of the other LDPC base graphs may overlap with the baseline LDPC base graph, but may also cover other information block lengths outside of the information block length range covered by the baseline LDPC base graph. For example, at least one of the LDPC base graphs 508 may be able to produce lower information block lengths than those produced by the baseline LDPC base graph.

The LDPC base graph selection circuitry 506 may initially compare the IBL 504 of the information block with the information block length ranges supported by each of the LDPC base graphs 508. If only one of the LDPC base graphs 508 supports the IBL 504 of the information block, the LDPC base graph selection circuitry 506 may select the single LDPC base graph 508 that supports the IBL 504. However, if more than one LDPC base graph 508 supports the IBL 504 of the information block, the LDPC base graph selection circuitry 506 may utilize other metrics to select an LDPC base graph 508 for the information block.

In some examples, if more than one LDPC base graph 508 supports the IBL 504, the LDPC base graph selection circuitry 506 may consider the CR 502 that may be utilized to encode the information block to select the LDPC base graph 508. For example, each LDPC base graph may support a respective code rate range. In examples where one of the LDPC base graphs 508 is a baseline LDPC base graph, the baseline LDPC base graph may support all or a large portion of the code rates utilized in a wireless communication network. Other LDPC base graphs 508 may support a subset of the code rate range of the baseline LDPC base graph and/or different code rates. Thus, each LDPC base graph may support a different code rate range. If the CR 502 to be utilized for the information block is only supported by one of the LDPC base graphs, the LDPC base graph selection circuitry 506 may select the LDPC base graph 508 that supports the CR 502.

However, if more than one LDPC base graph 508 supports the CR 502, the LDPC base graph selection circuitry 506 may select the LDPC base graph based on the respective lift size to be applied to each LDPC base graph 508 to produce the IBL 504 of the information block 504. In some examples, the LDPC base graph selection circuitry 506 may select the LDPC base graph 508 that provides the largest lift size to produce the IBL 504. For example, considering two LDPC base graphs (e.g., a first LDPC base graph and a second LDPC base graph), the LDPC base graph selection circuitry 506 may select the first LDPC base graph when the lift size applied to the first LDPC base graph to produce the IBL 504 is greater than the lift size applied to the second LDPC base graph to produce the IBL 504, and vice-versa.

The selected LDPC base graph 508 may then be input to LDPC graph selection circuitry 510 to select a particular LDPC graph 512 for use in encoding the information block. In certain circumstances, each LDPC base graph 508 may represent a set of two or more LDPC graphs 512. In some examples, the LDPC base graphs 508 represent a group of related LDPC graphs 512 having a number of bit nodes $K_b$ (columns in the matrix shown in FIG. 3) within a particular range of bit node numbers (e.g., $x <= K_b <= y$, where x and y define the minimum and maximum number of bit nodes within the group of related LDPC graphs). In some example, each LDPC base graph 508 corresponds to the LDPC graph 512 having the maximum number of bit nodes within the group of related LDPC graphs 512. The LDPC graph selection circuitry 510 may select one of the LDPC graphs 512, which may be the LDPC base graph 508, within the group of related LDPC graphs 512 for use in encoding the information block. The particular LDPC graph 512 may be selected based on, for example, the CR 502, IBL 504, lift size, or other factors that may be related to the performance of the encoder and/or decoder.

Figure 6:
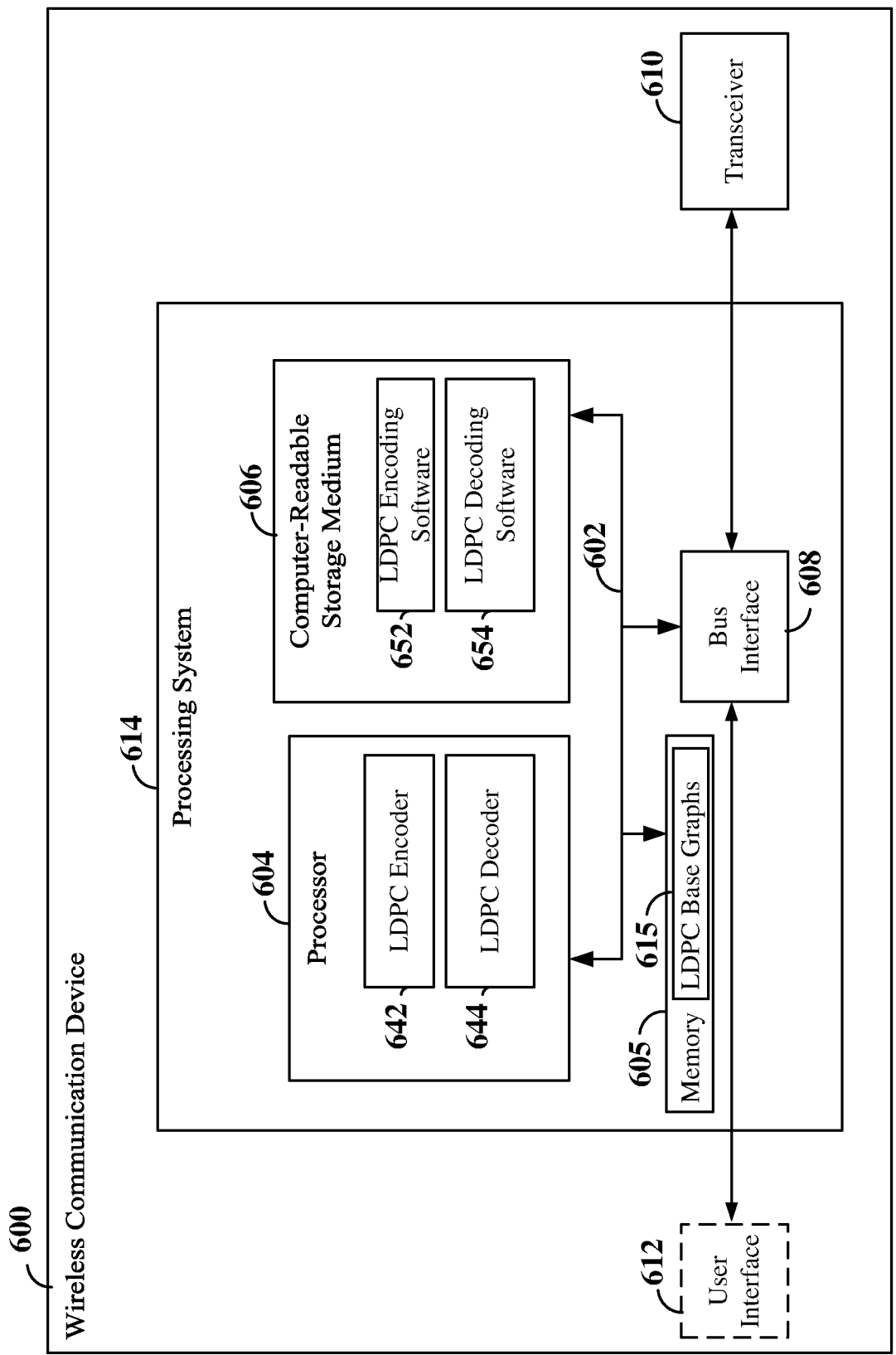
FIG. 6 is a block diagram illustrating an example of a hardware implementation for a wireless communication device employing a processing system according to some aspects of the present disclosure.

FIG. 6 is a conceptual diagram illustrating an example of a hardware implementation for an exemplary wireless communication device 600 employing a processing system 614. For example, the wireless communication device 600 may be a user equipment (UE), a base station, or any other suitable apparatus or means for wireless communication.

The wireless communication device 600 may be implemented with a processing system 614 that includes one or more processors 604. Examples of processors 604 include microprocessors, microcontrollers, digital signal processors (DSPs), field programmable gate arrays (FPGAs), programmable logic devices (PLDs), state machines, gated logic, discrete hardware circuits, and other suitable hardware configured to perform the various functionality described throughout this disclosure. In various examples, the wireless communication device 600 may be configured to perform any one or more of the functions described herein. That is, the processor 604, as utilized in a wireless communication device 600, may be used to implement any one or more of the processes described and illustrated in FIGS. 7-9.

In this example, the processing system 614 may be implemented with a bus architecture, represented generally by the bus 602. The bus 602 may include any number of interconnecting buses and bridges depending on the specific application of the processing system 614 and the overall design constraints. The bus 602 communicatively couples together various circuits including one or more processors (represented generally by the processor 604), a memory 605, and computer-readable media (represented generally by the computer-readable medium 606). The bus 602 may also link various other circuits such as timing sources, peripherals, voltage regulators, and power management circuits, which are well known in the art, and therefore, will not be described any further. A bus interface 608 provides an interface between the bus 602 and a transceiver 610. The transceiver 610 provides a means for communicating with various other apparatus over a transmission medium (e.g., air). Depending upon the nature of the apparatus, an optional user interface 612 (e.g., keypad, display, speaker, microphone, joystick) may also be provided. It should be understood that the user interface 612 may not be provided in some devices, such as a base station.

The processor 604 is responsible for managing the bus 602 and general processing, including the execution of software stored on the computer-readable medium 606. The software, when executed by the processor 604, causes the processing system 614 to perform the various functions described below for any particular apparatus. The computer-readable medium 606 and the memory 605 may also be used for storing data that is manipulated by the processor 604 when executing software.

One or more processors 604 in the processing system may execute software. Software shall be construed broadly to mean instructions, instruction sets, code, code segments, program code, programs, subprograms, software modules, applications, software applications, software packages, routines, subroutines, objects, executables, threads of execution, procedures, functions, etc., whether referred to as software, firmware, middleware, microcode, hardware description language, or otherwise. The software may reside on a computer-readable medium 606. The computer-readable medium 606 may be a non-transitory computer-readable medium. A non-transitory computer-readable medium includes, by way of example, a magnetic storage device (e.g., hard disk, floppy disk, magnetic strip), an optical disk (e.g., a compact disc (CD) or a digital versatile disc (DVD)), a smart card, a flash memory device (e.g., a card, a stick, or a key drive), a random access memory (RAM), a read only memory (ROM), a programmable ROM (PROM), an erasable PROM (EPROM), an electrically erasable PROM (EEPROM), a register, a removable disk, and any other suitable medium for storing software and/or instructions that may be accessed and read by a computer. The computer-readable medium may also include, by way of example, a carrier wave, a transmission line, and any other suitable medium for transmitting software and/or instructions that may be accessed and read by a computer.

The computer-readable medium 606 may reside in the processing system 614, external to the processing system 614, or distributed across multiple entities including the processing system 614. The computer-readable medium 606 may be embodied in a computer program product. By way of example, a computer program product may include a computer-readable medium in packaging materials. Those skilled in the art will recognize how best to implement the described functionality presented throughout this disclosure depending on the particular application and the overall design constraints imposed on the overall system.

In some aspects of the disclosure, the processor 604 may include circuitry configured for various functions. For example, the processor 604 may include low density parity check (LDPC) encoding circuitry 642 configured to receive an information block of a given block length and to encode the information block using LDPC encoding based on a particular code rate. In some examples, the LDPC encoding circuitry 642 may be configured to select an LDPC base graph from a plurality of LDPC base graphs 615 maintained, for example, in memory 605. The LDPC base graphs 615 may correspond to the LDPC base graphs 508 shown in FIG. 5. In addition, the LDPC encoding circuitry 642 may include the LDPC base graph selection circuitry 506 and LDPC graph selection circuitry 510 shown in FIG. 5. The LDPC encoding circuitry 642 may then select a particular LDPC graph represented by the LDPC base graph and utilize the selected LDPC graph to encode the information block to produce a codeword for transmission over a wireless air interface to a receiving wireless communication device via the transceiver 610. The codeword contains the information bits of the information block and parity check bits generated using the selected LDPC graph.

In some examples, the LDPC base graphs 615 may be designed for the wireless communication network over which the wireless communication device communicates and stored within memory 605. The LDPC base graphs 615 may include, for example, two or more LDPC base graphs, each associated with a different information block range. For example, the LDPC base graphs 615 may include a first LDPC base graph associated with a first information block length range and a second LDPC base graph associated with a second information block length range. The first information block length range may cover, for example, a baseline information block length range supported by the wireless communication network (e.g., between 100 and 8192 bits). The second information block length range may contain a subset of the first information block length range such that the second information block length is contained completely within the first information block length range (e.g., between 100 and 3200 bits) or overlaps the first information block length range (e.g., between 50 and 3200 bits). Additional LDPC base graphs 615 may also be designed and maintained in memory 605. For example, a third LDPC base graph may be designed to be associated with a third information block length range. The third information block length range may also contain a subset of the first information block length range such that the third information block length range is contained completely within the first information block length range (e.g., between 100 and 6400 bits) or overlaps the first and second information block length ranges (e.g., between 75 and 6400 bits).

The LDPC encoding circuitry 642 may further be configured to select the LDPC base graph from the plurality of LDPC base graphs 615 for encoding the information block based on the information block length of the information block. In some examples, if only one of the LDPC base graphs 615 supports the information block length of the information block, the LDPC encoding circuitry 642 may select the single LDPC base graph 615 that supports the information block length. However, if more than one LDPC base graph 615 supports the information block length of the information block, the LDPC encoding circuitry 642 may utilize other metrics to select an LDPC base graph 615 for the information block. Examples of other metrics include, but are not limited to, the code rate and the lift size.

In some examples, each of the LDPC base graphs 615 covers all possible code rates that may be used in the wireless communication network. In this example, the LDPC encoding circuitry 642 may select the LDPC base graph 615 that utilizes the highest lift size to produce the information block length of the information block. In other examples, one or more of the LDPC base graphs 615 may cover a different code rate range than other LDPC base graphs. For example, the first LDPC base graph may be associated with a first code rate range, while the second LDPC base graph may be associated with a second code rate range that overlaps the first code rate range, but also includes other code rates not within the first code rate range. In this example, if only one of the LDPC base graphs 615 supports the code rate of the information block, the LDPC encoding circuitry 642 may select the single LDPC base graph 615 that supports the code rate. However, if more than one LDPC base graph 615 supports the code rate of the information block, the LDPC encoding circuitry 642 may select the LDPC base graph 615 that utilizes the highest lift size to produce the information block length of the information block.

In some examples, the LDPC encoding circuitry 642 may further consider a parallelism constraint at the receiving wireless communication device when selecting the LDPC base graph 615. The parallelism constraint indicates the maximum number of edge messages that may be processed in parallel by the receiving wireless communication device. In some examples, the parallelism constraint is equal to or greater than the level of parallelism required to reach peak throughput. For example, the parallelism constraint may be equal to the largest lift size that is used in the peak throughput case. In one example, to achieve a maximum information block length of 8192 bits, the corresponding maximum lift size, and thus, degree of parallelism, may be equal to 320 to achieve a peak throughput of 20 Gb/s. In other examples, the parallelism constraint may be less than the level of parallelism required to reach peak throughput.

Using the above example of three LDPC base graphs, the LDPC encoding circuitry 642 may select the second LDPC base graph when the lift size applied to the second LDPC base graph to produce the information block length of the information block to be encoded is less than or equal to the parallelism constraint. The LDPC encoding circuitry 642 may further select the third LDPC base graph when the lift size applied to the second LDPC base graph to produce the information block length is greater than the parallelism constraint and the lift size applied to the third LDPC base graph to produce the information block length is less than or equal to the parallelism constraint. The LDPC encoding circuitry 642 may further select the first LDPC base graph when the lift size applied to the third LDPC base graph to produce the information block length is greater than the parallelism constraint.

In some examples, the LDPC encoding circuitry 642 may select the LDPC base graph based on factors other than the information block length, code rate, and/or lift size. For example, the LDPC encoding circuitry 642 may select the LDPC base graph based on the decoding speed expected at the receiving wireless communication device for each LDPC base graph (e.g., the LDPC base graph providing the highest decoding speed that is less than the peak throughput achieved at the parallelism constraint may be selected). The LDPC encoding circuitry 642 may operate in coordination with LDPC encoding software 652.

The processor 604 may further include LDPC decoding circuitry 644 configured to receive a codeword over a wireless air interface from a transmitting wireless communication device via the transceiver 610 and decode the codeword utilizing LDPC decoding to produce an information block of a given block length. In some examples, the LDPC decoding circuitry 644 may be configured to select an LDPC base graph from a plurality of LDPC base graphs 615 maintained, for example, in memory 605. The LDPC decoding circuitry 644 may then select an LDPC graph represented by the LDPC base graph and utilize the selected LDPC graph to decode the codeword to produce the information block. The LDPC decoding circuitry 644 may select the LDPC base graph for decoding of the codeword based on at least the information block length of the information block. The LDPC decoding circuitry 644 may further utilize the code rate, lift size, the parallelism constraint of the LDPC decoding circuitry 644, and/or other metrics to select the LDPC base graph. The LDPC decoding circuitry 644 may operate in coordination with LDPC decoding software 654.

Figure 7:
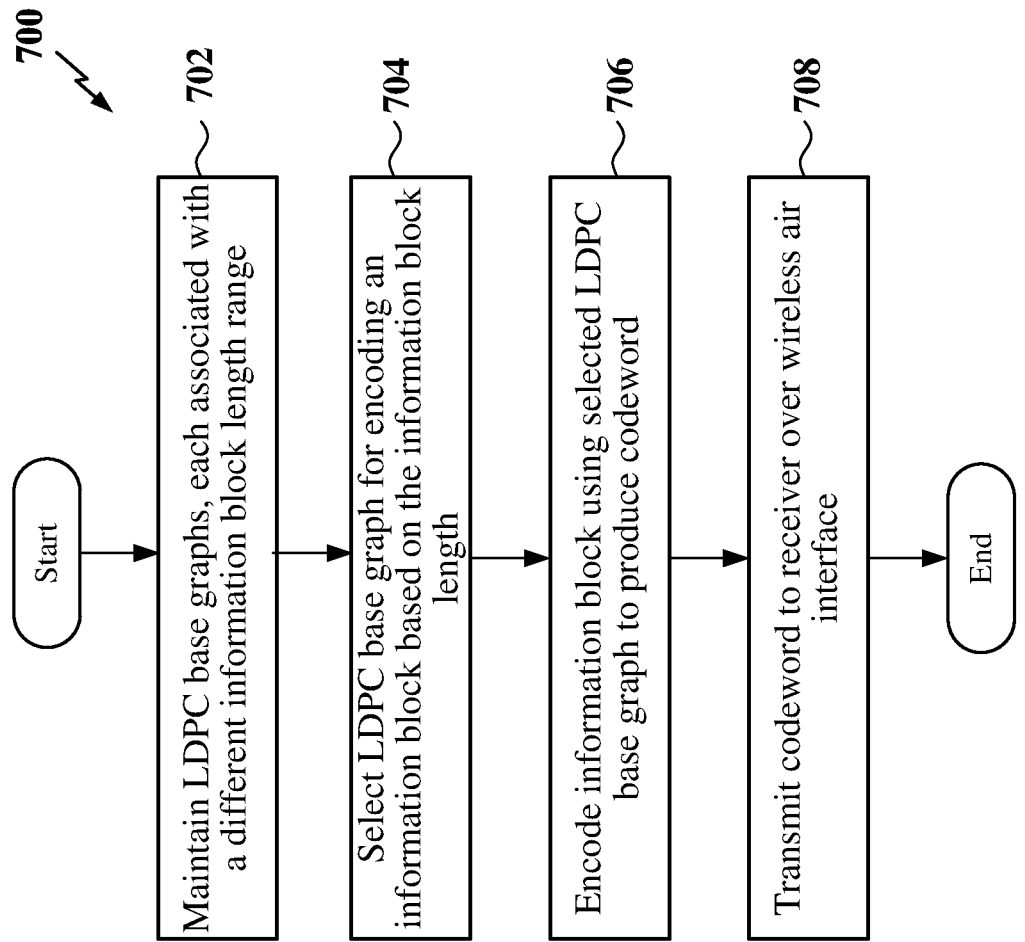
FIG. 7 is a flow chart of an exemplary method for LDPC encoding according to some aspects of the present disclosure.

FIG. 7 is a flow chart illustrating an exemplary process 700 for low density parity check (LDPC) encoding in accordance with some aspects of the present disclosure. As described below, some or all illustrated features may be omitted in a particular implementation within the scope of the present disclosure, and some illustrated features may not be required for implementation of all embodiments. In some examples, the process 700 may be carried out by the wireless communication device illustrated in FIG. 6. In some examples, the process 700 may be carried out by any suitable apparatus or means for carrying out the functions or algorithm described below.

At block 702, the wireless communication device may maintain multiple (e.g., two or more) LDPC base graphs, each associated with a different information block length range. For example, the LDPC base graphs may include a first LDPC base graph associated with a first information block length range and a second LDPC base graph associated with a second information block length range. The first information block length range may cover, for example, a baseline information block length range supported by the wireless communication network (e.g., between 100 and 8192 bits). The second information block length range may include a subset of the first information block length range such that the second information block length range is contained completely within the first information block length range (e.g., between 100 and 3200 bits) or overlaps the first information block length range (e.g., between 50 and 3200 bits). Additional LDPC base graphs may also be designed. The LDPC base graphs may be maintained, for example, in memory 605 shown and described above in reference to FIG. 6.

At block 704, the wireless communication device may select an LDPC base graph for encoding an information block of a given information block length. The LDPC base graph may be selected, for example, based, at least in part, on the given information block length of the information block. For example, the wireless communication device may select an LDPC base graph that supports the information block length of the information block. If more than one LDPC base graph supports the information block length of the information block, the wireless communication device may utilize other metrics, such as the code rate and/or lift size to select the LDPC base graph. For example, the LDPC encoding circuitry 642 shown and described above in reference to FIG. 6 may select an LDPC base graph for encoding the information block.

At block 706, the wireless communication device may encode the information block using the selected LDPC base graph to produce a codeword containing information bits of the information block and parity check bits produced by the LDPC encoding process. In some examples, the wireless communication device may select an LDPC graph represented by the LDPC base graph, which may be the LDPC base graph, to encode the information block. For example, the LDPC encoding circuitry 642 shown and described above in reference to FIG. 6 may encode the information block using the select LDPC base graph. At block 708, the wireless communication device may transmit the codeword over a wireless air interface to the receiver (e.g., a receiving wireless communication device). For example, the transceiver 610 shown and described above in reference to FIG. 6 may transmit the codeword to the receiving wireless communication device.

Figure 8:
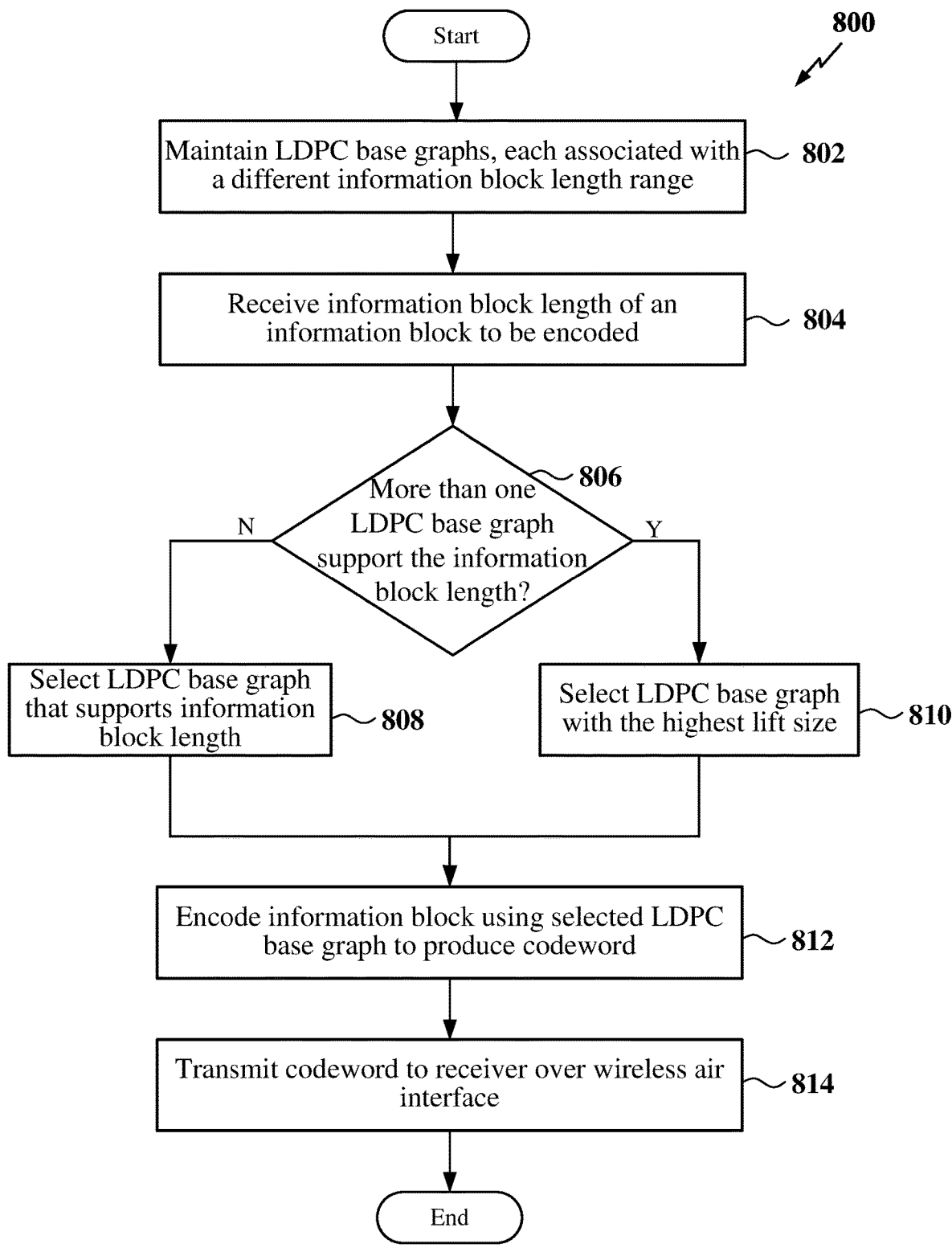
FIG. 8 is a flow chart of another exemplary method for LDPC encoding according to some aspects of the present disclosure.

FIG. 8 is a flow chart illustrating an exemplary process 800 for low density parity check (LDPC) encoding in accordance with some aspects of the present disclosure. As described below, some or all illustrated features may be omitted in a particular implementation within the scope of the present disclosure, and some illustrated features may not be required for implementation of all embodiments. In some examples, the process 800 may be carried out by the wireless communication device illustrated in FIG. 6. In some examples, the process 800 may be carried out by any suitable apparatus or means for carrying out the functions or algorithm described below.

At block 802, the wireless communication device may maintain multiple (e.g., two or more) LDPC base graphs, each associated with a different information block length range. For example, the LDPC base graphs may include a first LDPC base graph associated with a first information block length range and a second LDPC base graph associated with a second information block length range. The first information block length range may cover, for example, a baseline information block length range supported by the wireless communication network (e.g., between 100 and 8192 bits). The second information block length range may include a subset of the first information block length range such that the second information block length range is contained completely within the first information block length range (e.g., between 100 and 3200 bits) or overlaps the first information block length range (e.g., between 50 and 3200 bits). Additional LDPC base graphs may also be designed. The LDPC base graphs may be maintained, for example, in memory 605 shown and described above in reference to FIG. 6.

At block 804, the wireless communication device may receive an information block length of an information block to be encoded using LDPC coding. For example, the LDPC encoding circuitry 642 shown and described above in reference to FIG. 6 may receive the information block length of the information block. At block 806, the wireless communication device may determine whether more than one LDPC base graph supports the information block length of the information block.

If only a single LDPC base graph supports the information block length of the information block (N branch of block 806), at block 808, the wireless communication may select the LDPC base graph that supports the information block length of the information block for encoding of the information block. If more than one LDPC base graph supports the information block length of the information block (Y branch of block 806), at block 810, the wireless communication device may select the LDPC base graph with the highest lift size required to produce the information block length of the information block. For example, the LDPC encoding circuitry 642 shown and described above in reference to FIG. 6 may select an LDPC base graph for encoding the information block.

At block 812, the wireless communication device may encode the information block using the selected LDPC base graph to produce a codeword containing information bits of the information block and parity check bits produced by the LDPC encoding process. In some examples, the wireless communication device may select an LDPC graph represented by the LDPC base graph, which may be the LDPC base graph, to encode the information block. For example, the LDPC encoding circuitry 642 shown and described above in reference to FIG. 6 may encode the information block using the select LDPC base graph. At block 814, the wireless communication device may transmit the codeword over a wireless air interface to the receiver (e.g., a receiving wireless communication device). For example, the transceiver 610 shown and described above in reference to FIG. 6 may transmit the codeword to the receiving wireless communication device.

Figure 9:
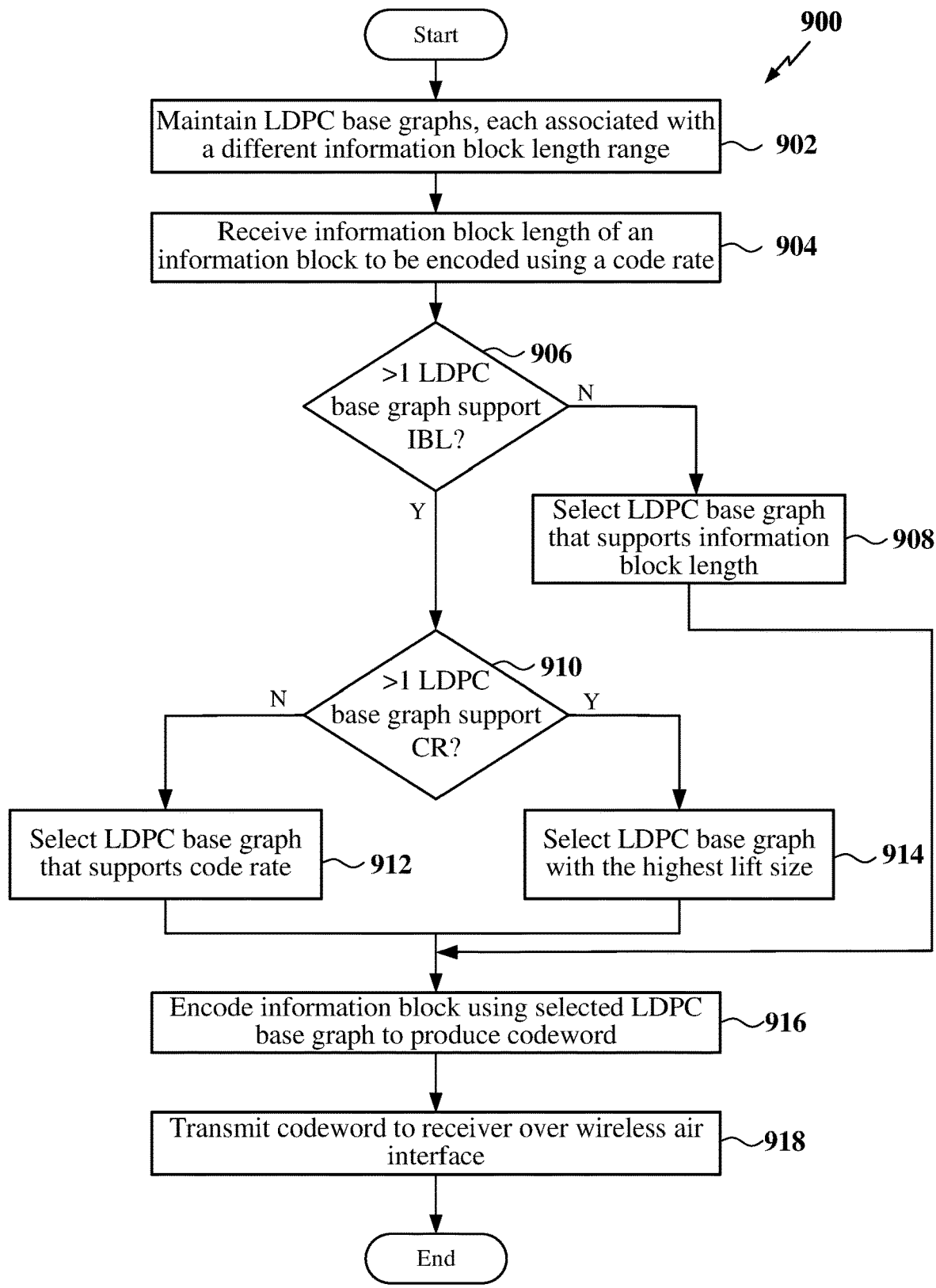
FIG. 9 is a flow chart of another exemplary method for LDPC encoding according to some aspects of the present disclosure.

FIG. 9 is a flow chart illustrating an exemplary process 900 for low density parity check (LDPC) encoding in accordance with some aspects of the present disclosure. As described below, some or all illustrated features may be omitted in a particular implementation within the scope of the present disclosure, and some illustrated features may not be required for implementation of all embodiments. In some examples, the process 900 may be carried out by the wireless communication device illustrated in FIG. 6. In some examples, the process 900 may be carried out by any suitable apparatus or means for carrying out the functions or algorithm described below.

At block 902, the wireless communication device may maintain multiple (e.g., two or more) LDPC base graphs, each associated with a different information block length range. For example, the LDPC base graphs may include a first LDPC base graph associated with a first information block length range and a second LDPC base graph associated with a second information block length range. The first information block length range may cover, for example, a baseline information block length range supported by the wireless communication network (e.g., between 100 and 8192 bits). The second information block length range may include a subset of the first information block length range such that the second information block length range is contained completely within the first information block length range (e.g., between 100 and 3200 bits) or overlaps the first information block length range (e.g., between 50 and 3200 bits). Additional LDPC base graphs may also be designed. The LDPC base graphs may be maintained, for example, in memory 605 shown and described above in reference to FIG. 6.

At block 904, the wireless communication device may receive an information block length of an information block to be LDPC encoded using a particular code rate. For example, the LDPC encoding circuitry 642 shown and described above in reference to FIG. 6 may receive the information block length of the information block. At block 906, the wireless communication device may determine whether more than one LDPC base graph supports the information block length of the information block.

If only a single LDPC base graph supports the information block length of the information block (N branch of block 906), at block 908, the wireless communication may select the LDPC base graph that supports the information block length of the information block for encoding of the information block. If more than one LDPC base graph supports the information block length of the information block (Y branch of block 906), at block 910, the wireless communication device may determine whether more than one LDPC base graph supports the code rate for encoding the information block.

If only a single LDPC base graph supports the code rate (N branch of block 910), at block 912, the wireless communication device may select the LDPC base graph that supports the code rate for encoding the information block. If more than one LDPC base graph supports the code rate (Y branch of block 910), at block 914, the wireless communication device may select the LDPC base graph with the highest lift size required to produce the information block length of the information block. For example, the LDPC encoding circuitry 642 shown and described above in reference to FIG. 6 may select an LDPC base graph for encoding the information block.

At block 916, the wireless communication device may encode the information block using the selected LDPC base graph to produce a codeword containing information bits of the information block and parity check bits produced by the LDPC encoding process. In some examples, the wireless communication device may select an LDPC graph represented by the LDPC base graph, which may be the LDPC base graph, to encode the information block. For example, the LDPC encoding circuitry 642 shown and described above in reference to FIG. 6 may encode the information block using the select LDPC base graph. At block 918, the wireless communication device may transmit the codeword over a wireless air interface to the receiver (e.g., a receiving wireless communication device). For example, the transceiver 610 shown and described above in reference to FIG. 6 may transmit the codeword to the receiving wireless communication device.

Figure 10:
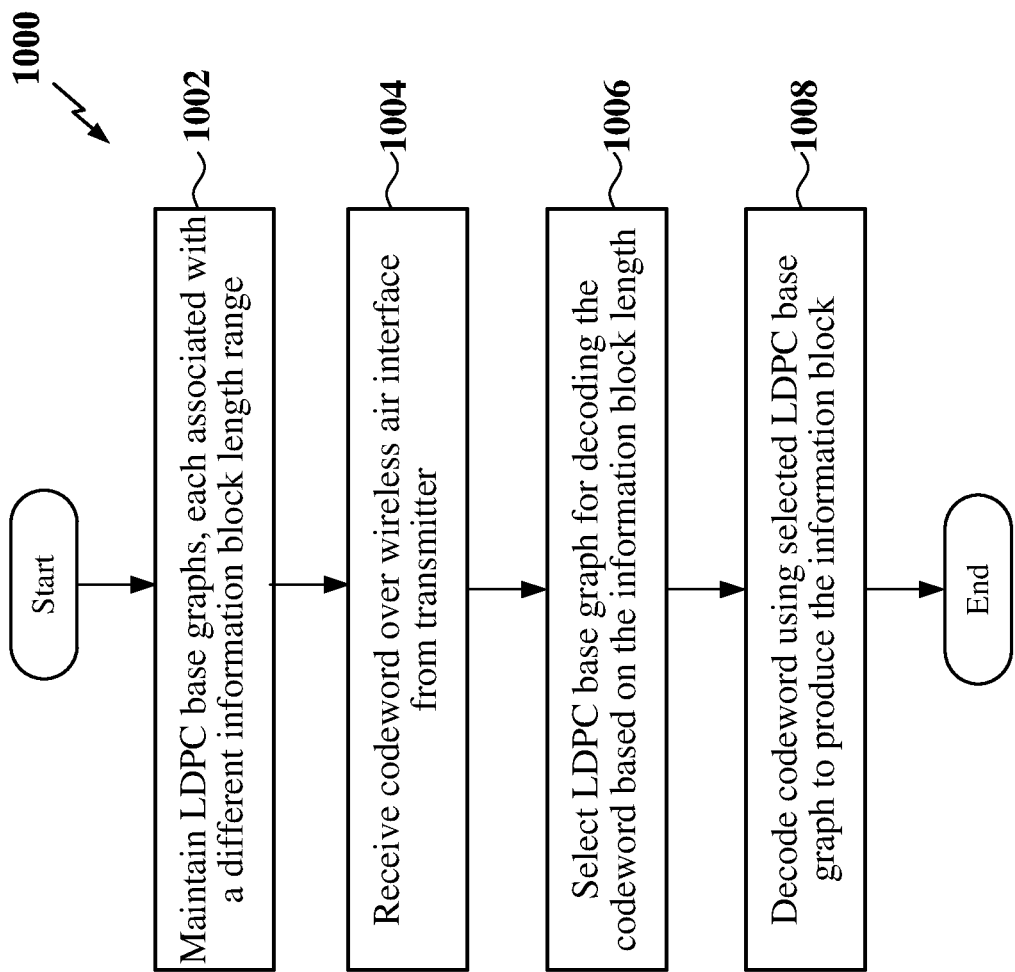
FIG. 10 is a flow chart of a method for LDPC decoding according to some aspects of the present disclosure.

FIG. 10 is a flow chart illustrating an exemplary process 1000 for low density parity check (LDPC) decoding in accordance with some aspects of the present disclosure. As described below, some or all illustrated features may be omitted in a particular implementation within the scope of the present disclosure, and some illustrated features may not be required for implementation of all embodiments. In some examples, the process 1000 may be carried out by the wireless communication device illustrated in FIG. 6. In some examples, the process 1000 may be carried out by any suitable apparatus or means for carrying out the functions or algorithm described below.

At block 1002, the wireless communication device may maintain multiple (e.g., two or more) LDPC base graphs, each associated with a different information block length range. For example, the LDPC base graphs may include a first LDPC base graph associated with a first information block length range and a second LDPC base graph associated with a second information block length range. The first information block length range may cover, for example, a baseline information block length supported by the wireless communication network (e.g., between 100 and 8192 bits). The second information block length range may include a subset of the first information block length range such that the second information block length range is contained completely within the first information block length range (e.g., between 100 and 3200 bits) or overlaps the first information block length range (e.g., between 50 and 3200 bits). Additional LDPC base graphs may also be designed. The LDPC base graphs may be maintained, for example, in memory 605 shown and described above in reference to FIG. 6.

At block 1004, the wireless communication device may receive a codeword over a wireless air interface from a transmitter (e.g., a transmitting wireless communication device). For example, the transceiver 610 shown and described above in reference to FIG. 6 may receive the codeword. At block 1006, the wireless communication device may select an LDPC base graph for decoding the codeword containing an information block of a given information block length. The LDPC base graph may be selected, for example, based on the given information block length of the information block. Other metrics, such as the code rate and/or lift size, may also be utilized to select an LDPC base graph. For example, the LDPC decoding circuitry 644 shown and described above in reference to FIG. 6 may select an LDPC base graph for decoding the information block.

At block 1008, the wireless communication device may decode the codeword using the selected LDPC base graph to produce the information block containing information bits.

In some examples, the wireless communication device may select an LDPC graph represented by the selected LDPC base graph, which may be the LDPC base graph, to decode the codeword. For example, the LDPC decoding circuitry 644 shown and described above in reference to FIG. 6 may decode the codeword using the select LDPC base graph.

In one configuration, an apparatus configured for low density parity check (LDPC) coding (e.g., the wireless communication device 500 shown in FIG. 5 and/or the wireless communication device 600 shown in FIG. 6) includes means for maintaining a plurality of LDPC base graphs, where the plurality of LDPC base graphs include at least a first LDPC base graph associated with a first information block length range and a second LDPC base graph associated with a second information block length range, and the second information block length range includes a subset of the first information block length range. The apparatus further includes means for receiving a codeword over a wireless air interface from a transmitter, means for selecting a select LDPC base graph from the plurality of LDPC base graphs for decoding the codeword based on an information block length associated with the codeword, and means for decoding the codeword utilizing the select LDPC base graph to produce an information block having the information block length.

In one aspect, the aforementioned means for maintaining the plurality of LDPC base graphs may be the memory 605 shown in FIG. 6. In another aspect, the aforementioned means for receiving the codeword may be the transceiver 610 shown in FIG. 6. In another aspect, the aforementioned means for selecting the select LDPC base graph may be the processor(s) 604 shown in FIG. 6 configured to perform the functions recited by the aforementioned means. For example, the aforementioned means for selecting the select LDPC base graph may include the LDPC decoding circuitry 644 shown in FIG. 6, the LDPC base graph selection circuitry 506 shown in FIG. 5, and/or the LDPC graph selection circuitry 510 shown in FIG. 5. In still another aspect, the aforementioned means for decoding the codeword may be the processor(s) 604 FIG. 6 configured to perform the functions recited by the aforementioned means. For example, the aforementioned means for decoding the codeword may include the LDPC decoding circuitry 644 shown in FIG. 6. In still another aspect, the aforementioned means may be a circuit or any apparatus configured to perform the functions recited by the aforementioned means.

Several aspects of a wireless communication network have been presented with reference to an exemplary implementation. As those skilled in the art will readily appreciate, various aspects described throughout this disclosure may be extended to other telecommunication systems, network architectures and communication standards.

By way of example, various aspects may be implemented within other systems defined by 3GPP, such as Long-Term Evolution (LTE), the Evolved Packet System (EPS), the Universal Mobile Telecommunication System (UMTS), and/or the Global System for Mobile (GSM). Various aspects may also be extended to systems defined by the 3rd Generation Partnership Project 2 (3GPP2), such as CDMA2000 and/or Evolution-Data Optimized (EV-DO). Other examples may be implemented within systems employing IEEE 802.11 (Wi-Fi), IEEE 802.16 (WiMAX), IEEE 802.20, Ultra-Wideband (UWB), Bluetooth, and/or other suitable systems. The actual telecommunication standard, network architecture, and/or communication standard employed will depend on the specific application and the overall design constraints imposed on the system.

Within the present disclosure, the word "exemplary" is used to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "coupled" is used herein to refer to the direct or indirect coupling between two objects. For example, if object A physically touches object B, and object B touches object C, then objects A and C may still be considered coupled to one another—even if they do not directly physically touch each other. For instance, a first object may be coupled to a second object even though the first object is never directly physically in contact with the second object. The terms "circuit" and "circuitry" are used broadly, and intended to include both hardware implementations of electrical devices and conductors that, when connected and configured, enable the performance of the functions described in the present disclosure, without limitation as to the type of electronic circuits, as well as software implementations of information and instructions that, when executed by a processor, enable the performance of the functions described in the present disclosure.

One or more of the components, steps, features and/or functions illustrated in FIGS. 1-10 may be rearranged and/or combined into a single component, step, feature or function or embodied in several components, steps, or functions. Additional elements, components, steps, and/or functions may also be added without departing from novel features disclosed herein. The apparatus, devices, and/or components illustrated in FIGS. 1-6 may be configured to perform one or more of the methods, features, or steps described herein. The novel algorithms described herein may also be efficiently implemented in software and/or embedded in hardware.

It is to be understood that the specific order or hierarchy of steps in the methods disclosed is an illustration of exemplary processes. Based upon design preferences, it is understood that the specific order or hierarchy of steps in the methods may be rearranged. The accompanying method claims present elements of the various steps in a sample order, and are not meant to be limited to the specific order or hierarchy presented unless specifically recited therein.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but are to be accorded the full scope consistent with the language of the claims, wherein reference to an element in the singular is not intended to mean "one and only one" unless specifically so stated, but rather "one or more." Unless specifically stated otherwise, the term "some" refers to one or more. A phrase referring to "at least one of" a list of items refers to any combination of those items, including single members. As an example, "at least one of: a, b, or c" is intended to cover: a; b; c; a and b; a and c; b and c; and a, b and c. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112(f) unless the element is expressly recited using the phrase "means for" or, in the case of a method claim, the element is recited using the phrase "step for."

What is claimed is:

1. A method of low density parity check (LDPC) decoding, the method comprising:
maintaining a first LDPC base graph associated with a first information block length range and a first code rate range, and a second LDPC base graph associated with a second information block length range and a second code rate range;
receiving a codeword over a wireless air interface from a transmitter;
selecting a select LDPC base graph from the first LDPC base graph and the second LDPC base graph for decoding the codeword based, at least in part, on an information block length or a code rate associated with the codeword; and
decoding the codeword utilizing the select LDPC base graph to produce an information block containing information bits.

2. The method of claim 1, wherein selecting the select LDPC base graph for decoding the codeword based, at least in part, on the information block length or the code rate further comprises:
selecting the first LDPC base graph as the select LDPC base graph if only the first LDPC base graph supports the information block length associated with the codeword.

3. The method of claim 1, wherein selecting the select LDPC base graph for decoding the codeword based, at least in part, on the information block length or the code rate further comprises:
selecting the select LDPC base graph based on the information block length and a lift size applied to the select LDPC base graph.

4. The method of claim 3, wherein selecting the select LDPC base graph based on the information block length and the lift size further comprises:
selecting the first LDPC base graph as the select LDPC base graph if a first lift size applied to the first LDPC base graph to produce the information block length is greater than a second lift size applied to the second LDPC base graph to produce the information block length.

5. The method of claim 1, wherein selecting the select LDPC base graph for decoding the codeword based, at least in part, on the information block length or the code rate further comprises:
selecting the select LDPC base graph based on the information block length and the code rate utilized to encode the information block to produce the codeword.

6. The method of claim 1, wherein the first code rate range is different from the second code rate range.

7. The method of claim 6, wherein the second code rate range overlaps the first code rate range and comprises additional code rates outside of the first code rate range.

8. The method of claim 6, wherein selecting the select LDPC base graph based, at least in part, on the information block length or the code rate further comprises:
selecting the first LDPC base graph as the select LDPC base graph if only the first code rate range comprises the code rate utilized to encode the information block.

9. The method of claim 1, wherein the second information block length range overlaps the first information block length range and comprises additional information block lengths outside of the first information block length range.

10. An apparatus configured for low density parity check (LDPC) coding, comprising:
a transceiver;
a memory; and
a processor communicatively coupled to the transceiver and the memory, the processor configured to:
maintain, within the memory, a first LDPC base graph associated with a first information block length range and a first code rate range, and a second LDPC base graph associated with at least one of a second information block length range and a second code rate range;
receive a codeword over a wireless air interface from a transmitter via the transceiver;
select a select LDPC base graph from the first LDPC base graph and the second LDPC base graph for decoding the codeword based, at least in part, on an information block length or a code rate associated with the codeword; and
decode the codeword utilizing the select LDPC base graph to produce an information block containing information bits.

11. The apparatus of claim 10, wherein the processor is further configured to:
select the first LDPC base graph as the select LDPC base graph if only the first LDPC base graph supports the information block length associated with the codeword.

12. The apparatus of claim 10, wherein the processor is further configured to:
select the select LDPC base graph further based, at least in part, on a lift size applied to the select LDPC base graph.

13. The apparatus of claim 12, wherein the processor is further configured to:
select the first LDPC base graph as the select LDPC base graph if a first lift size applied to the first LDPC base graph to produce the information block length is greater than a second lift size applied to the second LDPC base graph to produce the information block length.

14. The apparatus of claim 10, wherein the processor is further configured to:
select the select LDPC base graph based on the information block length and the code rate utilized to encode the information block to produce the codeword.

15. The apparatus of claim 10, wherein the first code rate range is different from the second code rate range.

16. The apparatus of claim 15, wherein the second code rate range overlaps the first code rate range and comprises additional code rates outside of the first code rate range.

17. The apparatus of claim 15, wherein the processor is further configured to:
select the first LDPC base graph as the select LDPC base graph if only the first code rate range comprises the code rate utilized to encode the information block to produce the codeword.

18. The apparatus of claim 10, wherein the second information block length range overlaps the first information block length range and comprises additional information block lengths outside of the first information block length range.

19. A wireless communication device, comprising:
means for maintaining a first LDPC base graph associated with a first information block length range and a first code rate range, and a second LDPC base graph associated with at least one of a second information block length range and a second code rate range;

means for receiving a codeword over a wireless air interface from a transmitter;

means for selecting a select LDPC base graph from the first LDPC base graph and the second LDPC base graph for decoding the codeword based, at least in part, on an information block length or a code rate associated with the codeword; and means for decoding the codeword utilizing the select LDPC base graph to produce an information block containing information bits.

20. The wireless communication device of claim 19, wherein the means for selecting the select LDPC base graph further comprises:

means for selecting the first LDPC base graph as the select LDPC base graph if only the first LDPC base graph supports the information block length associated with the codeword.

21. The wireless communication device of claim 19, wherein the means for selecting the select LDPC base graph further comprises:

means for selecting the select LDPC base graph based on the information block length and the code rate utilized to encode the information block to produce the codeword.

22. The wireless communication device of claim 19, wherein the first LDPC base graph is associated with a first code rate range and the second LDPC base graph is associated with a second code rate range, and wherein the means for selecting the select LDPC base graph further comprises:

means for selecting the first LDPC base graph as the select LDPC base graph if only the first code rate range comprises the code rate utilized to encode the information block to produce the codeword.

23. The wireless communication device of claim 22, wherein the second code rate range overlaps the first code rate range and comprises additional code rates outside of the first code rate range.

24. The wireless communication device of claim 19, wherein the second information block length range overlaps the first information block length range and comprises additional information block lengths outside of the first information block length range.

25. A non-transitory computer-readable medium storing computer executable code, comprising code for causing a computer to:

maintain a first LDPC base graph associated with a first information block length range and a first code rate range, and a second LDPC base graph associated with at least one of a second information block length range and a second code rate range;

receive a codeword over a wireless air interface from a transmitter;

select a select LDPC base graph from the first LDPC base graph and the second LDPC base graph for decoding the codeword based, at least in part, on an information block length or a code rate associated with the codeword; and decode the codeword utilizing the select LDPC base graph to produce an information block containing information bits.

26. The non-transitory computer-readable medium of claim 25, further comprising code for causing the computer to:

select the first LDPC base graph as the select LDPC base graph if only the first LDPC base graph supports the information block length associated with the codeword.

27. The non-transitory computer-readable medium of claim 25, further comprising code for causing the computer to:

select the select LDPC base graph based on the information block length and the code rate utilized to encode the information block to produce the codeword.

28. The non-transitory computer-readable medium of claim 25, wherein the first LDPC base graph is associated with a first code rate range and the second LDPC base graph is associated with a second code rate range, and further comprising code for causing the computer to:

select the first LDPC base graph as the select LDPC base graph if only the first code rate range comprises the code rate utilized to encode the information block to produce the codeword.

\* \* \* \* \*